United States Patent
Karim et al.

(10) Patent No.: US 12,077,859 B2
(45) Date of Patent: Sep. 3, 2024

(54) VARIABLE CYCLE AND TIME RF ACTIVATION METHOD FOR FILM THICKNESS MATCHING IN A MULTI-STATION DEPOSITION SYSTEM

(71) Applicant: Lam Research Corporation, Fremont, CA (US)

(72) Inventors: Ishtak Karim, San Jose, CA (US); Kiyong Cho, Edmonds, OR (US); Adrien LaVoie, Newberg, OR (US); Jaswinder Guliani, Beaverton, OR (US); Purushottam Kumar, Hillsboro, OR (US); Jun Qian, Sherwood, OR (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 17/587,560

(22) Filed: Jan. 28, 2022

(65) Prior Publication Data
US 2022/0154336 A1    May 19, 2022

Related U.S. Application Data

(62) Division of application No. 15/143,338, filed on Apr. 29, 2016, now abandoned.

(51) Int. Cl.
| | | |
|---|---|---|
| C23C 16/455 | (2006.01) | |
| C23C 16/52 | (2006.01) | |
| C23C 16/54 | (2006.01) | |

(52) U.S. Cl.
CPC .. *C23C 16/45536* (2013.01); *C23C 16/45527* (2013.01); *C23C 16/45542* (2013.01); *C23C 16/52* (2013.01); *C23C 16/54* (2013.01)

(58) Field of Classification Search
None
See application file for complete search history.

(56) References Cited

U.S. PATENT DOCUMENTS

| | | | |
|---|---|---|---|
| 5,879,459 A | 3/1999 | Gadgil et al. | |
| 6,042,652 A | 3/2000 | Hyun et al. | |
| 6,143,082 A | 11/2000 | McInerney et al. | |
| 6,860,965 B1 | 3/2005 | Stevens | |
| 8,119,527 B1 | 2/2012 | Chadrashekar et al. | |
| 8,637,411 B2 | 1/2014 | Swaminathan et al. | |
| 8,728,956 B2 | 5/2014 | LaVoie et al. | |
| 8,940,646 B1 | 1/2015 | Chandrasekharan et al. | |
| 8,956,983 B2 | 2/2015 | Swaminathan et al. | |

(Continued)

FOREIGN PATENT DOCUMENTS

| | | |
|---|---|---|
| CN | 1853003 A | 10/2006 |
| CN | 101330015 A | 12/2008 |

(Continued)

OTHER PUBLICATIONS

Chinese First Office Action dated Feb. 12, 2019, issued in Application No. CN 201710291562.X.

(Continued)

*Primary Examiner* — Michael G Miller
(74) *Attorney, Agent, or Firm* — Weaver Austin Villeneuve & Sampson LLP

(57) ABSTRACT

Methods and apparatuses for depositing approximately equal thicknesses of a material on at least two substrates concurrently processed in separate stations of a multi-station deposition apparatus are provided.

26 Claims, 8 Drawing Sheets

(56) References Cited

U.S. PATENT DOCUMENTS

| | | | |
|---|---|---|---|
| 9,076,646 | B2 | 7/2015 | Sims et al. |
| 9,263,350 | B2 | 2/2016 | Kapoor et al. |
| 9,355,886 | B2 | 5/2016 | Swaminathan et al. |
| 9,502,238 | B2 | 11/2016 | Danek et al. |
| 9,677,176 | B2 | 6/2017 | Chandrasekharan et al. |
| 9,797,042 | B2 | 10/2017 | Nowak et al. |
| 10,577,691 | B2 | 3/2020 | Nowak et al. |
| 10,697,059 | B2 | 6/2020 | Phillips et al. |
| 11,286,560 | B2 | 3/2022 | Phillips et al. |
| 2002/0100418 | A1 | 8/2002 | Sandhu et al. |
| 2005/0019963 | A1 | 1/2005 | Zhao et al. |
| 2005/0031786 | A1 | 2/2005 | Lee et al. |
| 2006/0166501 | A1 | 7/2006 | Kaushal et al. |
| 2006/0210723 | A1 | 9/2006 | Ishizaka |
| 2006/0280868 | A1 | 12/2006 | Kato et al. |
| 2007/0099420 | A1 | 5/2007 | Dominguez et al. |
| 2007/0235059 | A1 | 10/2007 | Chu et al. |
| 2008/0131601 | A1 | 6/2008 | Kim et al. |
| 2008/0242116 | A1 | 10/2008 | Clark |
| 2009/0325366 | A1 | 12/2009 | Moriya et al. |
| 2012/0009802 | A1 | 1/2012 | LaVoie et al. |
| 2012/0288615 | A1 | 11/2012 | Jung |
| 2012/0325145 | A1 | 12/2012 | Satoyoshi et al. |
| 2013/0045548 | A1 | 2/2013 | Käppeler et al. |
| 2013/0196078 | A1 | 8/2013 | Yudovsky et al. |
| 2013/0210241 | A1 | 8/2013 | LaVoie et al. |
| 2014/0030444 | A1 | 1/2014 | Swaminathan et al. |
| 2014/0113457 | A1 | 4/2014 | Sims et al. |
| 2015/0017812 | A1 | 1/2015 | Chandrasekharan et al. |
| 2015/0329206 | A1 | 11/2015 | Larson et al. |
| 2015/0332912 | A1 | 11/2015 | Nowak et al. |
| 2015/0348854 | A1 | 12/2015 | Kapoor et al. |
| 2016/0020092 | A1 | 1/2016 | Kang et al. |
| 2016/0079054 | A1 | 3/2016 | Chen et al. |
| 2016/0090650 | A1 | 3/2016 | Qian et al. |
| 2016/0340782 | A1 | 11/2016 | Chandrasekharan et al. |
| 2016/0348242 | A1 | 12/2016 | Sung et al. |
| 2017/0029947 | A1 | 2/2017 | Kawahara et al. |
| 2017/0029948 | A1 | 2/2017 | Jongbloed et al. |
| 2017/0314129 | A1 | 11/2017 | Karim et al. |
| 2017/0316988 | A1 | 11/2017 | Kang et al. |
| 2018/0010250 | A1 | 1/2018 | Nowak et al. |
| 2018/0247875 | A1 | 8/2018 | Kang et al. |
| 2018/0358271 | A1 | 12/2018 | David |
| 2019/0085448 | A1 | 3/2019 | Phillips et al. |
| 2019/0344307 | A1 | 11/2019 | Singh et al. |
| 2019/0345608 | A1 | 11/2019 | Agarwal et al. |
| 2020/0299838 | A1 | 9/2020 | Phillips et al. |
| 2020/0333774 | A1 | 10/2020 | Banna |
| 2022/0285232 | A1 | 9/2022 | Baryshnikov et al. |
| 2022/0351940 | A1 | 11/2022 | Fields et al. |

FOREIGN PATENT DOCUMENTS

| | | | |
|---|---|---|---|
| CN | 102191483 | A | 9/2011 |
| CN | 102758191 | A | 10/2012 |
| CN | 102839360 | A | 12/2012 |
| CN | 105088197 | A | 11/2015 |
| CN | 105463408 | A | 4/2016 |
| CN | 105914280 | A | 8/2016 |
| CN | 107799390 | A | 3/2018 |
| JP | H09213689 | A | 8/1997 |
| JP | 2004068091 | A | 3/2004 |
| JP | 2008513980 | A | 5/2008 |
| JP | 2013526017 | A | 6/2013 |
| JP | 2014523479 | A | 9/2014 |
| JP | 2015209355 | A | 11/2015 |
| JP | 2015220458 | A | 12/2015 |
| JP | 2016046524 | A | 4/2016 |
| JP | 2017045927 | A | 3/2017 |
| JP | 2021125566 | A | 8/2021 |
| KR | 20070000279 | A | 1/2007 |
| KR | 100715862 | B1 | 5/2007 |
| KR | 20110055496 | A | 5/2011 |
| KR | 20130086989 | A | 8/2013 |
| KR | 20130093569 | A | 8/2013 |
| KR | 20130115261 | A | 10/2013 |
| KR | 20130127588 | A | 11/2013 |
| KR | 20130136034 | A | 12/2013 |
| KR | 20140037198 | A | 3/2014 |
| KR | 20140051807 | A | 5/2014 |
| KR | 20150133644 | A | 11/2015 |
| KR | 20160038783 | A | 4/2016 |
| KR | 20160127674 | A | 11/2016 |
| TW | I277139 | B | 3/2007 |
| TW | 201608612 | A | 3/2016 |
| WO | WO-2011125471 | A1 | 10/2011 |
| WO | WO-2012170166 | A2 | 12/2012 |
| WO | WO-2014142031 | A1 | 9/2014 |
| WO | WO-2020185539 | A1 | 9/2020 |
| WO | WO-2021081304 | A1 | 4/2021 |
| WO | WO-2022008906 | A1 | 1/2022 |

OTHER PUBLICATIONS

Chinese First Office Action dated May 24, 2017, issued in Application No. CN 201510245528.X.

Chinese Fourth Office Action dated Jul. 3, 2020 issued in Application No. CN 201710291562.X.

Chinese Second Office Action dated Feb. 23, 2018, issued in Application No. CN 201510245528.X.

Chinese Second Office Action dated Sep. 9, 2019, issued in Application No. CN 201710291562.X.

Chinese Third Office Action dated Apr. 1, 2020, issued in Application No. CN 201710291562.X.

Chinese Third Office Action dated Sep. 25, 2018, issued in Application No. CN 201510245528.X.

International Preliminary Report on Patentability dated Mar. 26, 2020 issued in Application No. PCT/US2018/049864.

International Preliminary Report on Patentability dated May 19, 2022, in PCT Application No. PCT/US2020/059140.

International Search Report and Written Opinion dated Feb. 1, 2019 issued in Application No. PCT/US18/49864.

Japanese Decision to Grant dated dated Jul. 16, 2019, issued in Application No. JP 2015- 095293.

Japanese Decision to Grant dated May 28, 2021 issued in Application No. JP 2017-083755.

Japanese Office Action [Reason for Refusal] dated Mar. 27, 2019, issued in Application No. JP 2015-095293.

Korean Decision for Grant dated Jun. 9, 2021 issued in Application No. KR 10-2017-0049539.

Korean Office Action dated Jun. 29, 2021, issued in Application No. KR 10-2015-0068349.

KR Office Action dated Jan. 28, 2022, in Application No. KR10-2015-0068349 with English Translation.

KR Office Action dated Jan. 10, 2022, in Application No. KR1020210120640.

Notice of Allowance dated Nov. 17, 2021, in U.S. Appl. No. 16/946,009.

PCT International Search Report and Written Opinion, dated Feb. 26, 2021, issued in PCT/US2020/059140.

Singapore Notice of Eligibility for Grant & Supplementary Examination Report dated Jan. 17, 2020 in SG Application No. 10201503283S.

Singapore Search Report and Written Opinion dated Jan. 20, 2020 in SG Application No. 10201703133P.

Taiwanese First Office Action dated Oct. 1, 2018, issued in Application No. TW 104115353.

TW Office Action dated May 31, 2022, in Application No. TW106113839 with English Translation.

US Final Office Action, dated Aug. 15, 2019, issued in U.S. Appl. No. 15/143,338.

US Final Office Action, dated Mar. 7, 2017, issued in U.S. Appl. No. 14/455,796.

US Final Office Action dated Oct. 31, 2019 in U.S. Appl. No. 15/785,093.

US Notice of Allowance, dated Jun. 15, 2017, issued in U.S. Appl. No. 14/455,796.

(56) References Cited

OTHER PUBLICATIONS

US Notice of Allowance dated Mar. 4, 2020 in U.S. Appl. No. 15/785,093.
US Notice of Allowance, dated Oct. 10, 2019, issued in U.S. Appl. No. 15/703,694.
US Office Action, dated Aug. 26, 2016, issued in U.S. Appl. No. 14/455,796.
US Office Action dated Aug. 6, 2019 in U.S. Appl. No. 15/785,093.
US Office Action, dated Feb. 7, 2019, issued in U.S. Appl. No. 15/143,338.
US Office Action, dated Jun. 13, 2019, issued in U.S. Appl. No. 15/703,694.
U.S. Appl. No. 17/755,630, filed May 4, 2022.
US Patent Board Decision on Appeal Before the Patent Trial and Appeal Board (Examiner Affirmed) dated Dec. 1, 2021 issued U.S. Appl. No. 15/143,338.
U.S Supplemental Notice of Allowability dated Mar. 3, 2022, in U.S. Appl. No. 16/946,009.
CN Office Action dated Jul. 13, 2022 in Application No. CN201710291562.X with English translation.
CN Office Action dated Oct. 28, 2022, in Application No. CN201710291562.X with English translation.
JP Office Action dated Sep. 27, 2022, in Application No. JP2021-109808 with English translation.
CN Office Action dated Mar. 16, 2023, in Application No. CN201880059891.4 with English translation.
International Search Report and Written Opinion dated Jan. 11, 2023, in Application No. PCT/US2022/076848.
TW Office Action dated Oct. 16, 2023, in application No. TW112134025 with English translation.
U.S. Non-Final Office Action dated Aug. 24, 2023 in U.S. Appl. No. 17/755,630.
TW Office Action dated Jan. 19, 2023 in Application No. TW111130779 with English translation.
U.S. Restriction requirement dated Apr. 3, 2023 in U.S. Appl. No. 17/755,630.
CN Office Action dated Dec. 1, 2023, in CN Application No. 202080077774.8 with English translation.
International Search Report and Written Opinion dated Jan. 8, 2024 in PCT Application No. PCT/US2023/033209.
KR Office Action dated Jan. 17, 2024 in KR Application No. 10-2020-7010706, with English Translation.
U.S. Final Office Action dated Feb. 7, 2024 in U.S. Appl. No. 17/755,630.
International Preliminary Report on Patentability and Written Opinion dated Apr. 18, 2024 in PCT Application No. PCT/US2022/076848.
U.S. Advisory Action dated Apr. 11, 2024 in U.S. Appl. No. 17/755,630.
U.S. Appl. No. 18/698,276, inventors Agnew D W, et al., filed Apr. 3, 2024.

| Wafer # | Incoming Wafer Critical Dimension | Feedforward input to ALD | ALD output (CD final) |
|---|---|---|---|
| 1 | 420A | 100A | 220A |
| 2 | 422A | 101A | 220A |
| 3 | 424A | 102A | 220A |
| 4 | 426A | 103A | 220A |

Figure 6

VARIABLE CYCLE AND TIME RF ACTIVATION METHOD FOR FILM THICKNESS MATCHING IN A MULTI-STATION DEPOSITION SYSTEM

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Some semiconductor manufacturing processes deposit one or more layers of a material onto a semiconductor substrate or wafer. Integrated circuit fabricators and equipment designers employ various process and apparatus arrangements to produce integrated circuits of uniform quality and with high throughput. Material deposition systems such as chemical vapor deposition chambers are operated in different modes, some that emphasize high throughput and others that emphasize uniformity. Defining modes of operation that optimizes both throughput and uniformity remains a challenge.

SUMMARY

In one embodiment, a method of depositing approximately equal thicknesses of a material on at least two substrates concurrently processed in separate stations of a multi-station deposition apparatus is provided. The method may include (a) providing a first substrate in a first station and a second substrate in a second station of the deposition apparatus, (b) concurrently depositing the material on the first substrate in the first station and on the second substrate in the second station, wherein deposition conditions in the first and second stations are substantially the same, but yet produce a thicker layer of the material on the first substrate in the first station than on the second substrate in the second station, (c) adjusting the deposition conditions in the first station to slow or stop depositing the material on the first substrate while continuing to deposit the material on the second substrate in the second station under the conditions in (b), and (d) completing deposition on the first substrate in the first station and the second substrate in the second station such that a total thickness of the material deposited on the first substrate and on the second substrate is substantially equal.

In one such embodiment, the deposition conditions may include exposing the first substrate and the second substrate to a precursor of the material.

In further such embodiments, adjusting the deposition conditions may include reducing or stopping flow of the precursor to the first station.

In another embodiment, the deposition conditions may include exposing the first substrate and the second substrate to a plasma.

In further such embodiments, adjusting the deposition conditions may include reducing or stopping the exposure of the first substrate to the plasma.

In some embodiments, the first wafer may not move from the first station during (b) and (c)

In one such embodiment, (b) may include a cyclic repetition of (i) precursor dosing to absorb precursor on the first and second substrates, and (ii) exposing the first and second substrates to plasma to cause the precursor to react to form the material.

In further such embodiments, (c) may include stopping the precursor dosing and/or the plasma exposure in the first station to thereby reduce a thickness of the material deposited during the cyclic repetitions, while continuing to conduct the cyclic repetitions on the second substrate in the second station under the conditions in (b).

In other further such embodiments, (c) may include adjusting the duration or power of the plasma in the first station to thereby reduce a thickness of the material deposited during the cyclic repetitions, while continuing to conduct the cyclic repetitions on the second substrate in the second station under the conditions in (b).

In one other embodiment, the method may further include, before or during (b), analyzing measurement information regarding the relative deposition rates in the first and second stations, and using the measurement information to determine how to adjust the deposition conditions in (c).

In further such embodiments, the measurement information may be obtained during (b).

In some embodiments, the method may further include, before or during (b), analyzing measurement information regarding physical characteristics of the first substrate and the second substrate, and using the measurement information to determine how to adjust the deposition conditions in (c).

In one embodiment, a method of semiconductor deposition for creating approximately equal thicknesses of a material on at least two substrates concurrently processed in separate stations of a multi-station deposition apparatus may be provided. The method may include (a) providing a first substrate in a first station and a second substrate in a second station of the deposition apparatus, (b) exposing, at the same time, the first substrate in the first station and the second substrate in the second station to a precursor of the material, (c) activating, at the same time, a reaction of the precursor on the first substrate in the first station and a reaction of the precursor on the second substrate in the second station, (d) performing (b) and (c) for N1 cycles, each of the N1 cycles including depositing a thin film of substantially equal thickness t1 of the material on the first substrate and a thin film of substantially equal thickness t2 of the material on the second substrate, and performing N1 cycles creates a total deposition thickness T1 of the material on the first substrate and a total deposition thickness T2A of the material on the second substrate, wherein T1 is greater than T2A, and (e) exposing the second substrate in the second station to the precursor and activating a reaction of the precursor on the second substrate in the second station for N2 cycles, each of the N2 cycles includes depositing a thin film of substantially equal thickness t2 of the material on the second substrate, each of the N2 cycles includes the first substrate remaining in the first station and slowing or stopping the deposition of a layer of the material on the first substrate, and performing N1 and N2 cycles creates a total deposition thickness T2 of the material on the second substrate that is substantially equal to T1.

In one such embodiment, the activating in (c) may include independently providing a plasma in each station for a first plasma time at a first plasma power, and the activating in (e) may include independently providing a plasma in the second station.

In one further such embodiment, the activating in (e) may include independently providing a plasma in the second station for a second plasma time that is different than the first plasma time, and the thin film of substantially equal thickness t2 deposited in each N1 cycle may be different than the thin film of substantially equal thickness t2 deposited in each N2 cycle.

In one other further such embodiment, the activating in (e) may include independently providing a plasma in the second station at a second plasma power level that is different than the first plasma power level, and the thin film of substantially equal thickness t2 deposited in each N1 cycle may be different than the thin film of substantially equal thickness t2 deposited in each N2 cycle.

In some embodiments, the exposing in (c) may include flowing a precursor for a first exposure time to the first station and the second station, the exposing in (e) may include flowing a precursor for a second exposure time to the second station, and the thin film of substantially equal thickness t2 deposited in each N1 cycle may be different than the thin film of substantially equal thickness t2 deposited in each N2 cycle.

In one embodiment, a multi-station deposition apparatus may be provided. The apparatus may include a vacuum system, a gas delivery system, a processing chamber that includes at least two stations, each station shares the vacuum system and the gas delivery system, and a controller for controlling the multi-station deposition apparatus to deposit approximately equal thicknesses of a material on at least two substrates concurrently processed in separate stations. The controller may include control logic for (a) providing a first substrate in a first station and a second substrate in a second station of the deposition apparatus, (b) concurrently depositing the material on the first substrate in the first station and on the second substrate in the second station, deposition conditions in the first and second stations are substantially the same, but yet produce a thicker layer of the material on the first substrate in the first station than on the second substrate in the second station, (c) adjusting the deposition conditions in the first station to slow or stop depositing the material on the first substrate while continuing to deposit the material on the second substrate in the second station under the conditions in (b), and (d) completing deposition on the first substrate in the first station and the second substrate in the second station such that a total thickness of the material deposited on the first substrate and on the second substrate is substantially equal.

In one such embodiment, each station may include a showerhead to distribute a precursor of the material onto the substrate in that station, and the gas delivery system may be configured to control delivery of the precursor of the material to each station.

In one further embodiment, the controller may further include control logic for independently controlling precursor delivery to each station, and adjusting the deposition conditions in (c) may include reducing or stopping flow of the precursor to the first station.

In one other embodiment, the apparatus may further include a plasma source configured to independently form and maintain a plasma in each station, the controller may further include control logic for independently forming and maintaining a plasma in each station, and the deposition conditions in (b) may include exposing the first substrate and the second substrate to the plasma.

In one further embodiment, the controller may further include control logic for independently controlling a plasma power level in each station, and adjusting the deposition conditions in (c) may include reducing or stopping the exposure of the first substrate to the plasma.

In one other further embodiment, the controller may further include control logic for independently controlling a plasma time in each station, and adjusting the deposition conditions in (c) may include reducing or stopping the exposure of the first substrate to the plasma.

BRIEF DESCRIPTION OF THE DRAWINGS

FIG. 6 depicts a chart of an example implementation using feed forward information.

DETAILED DESCRIPTION

Figure 1:
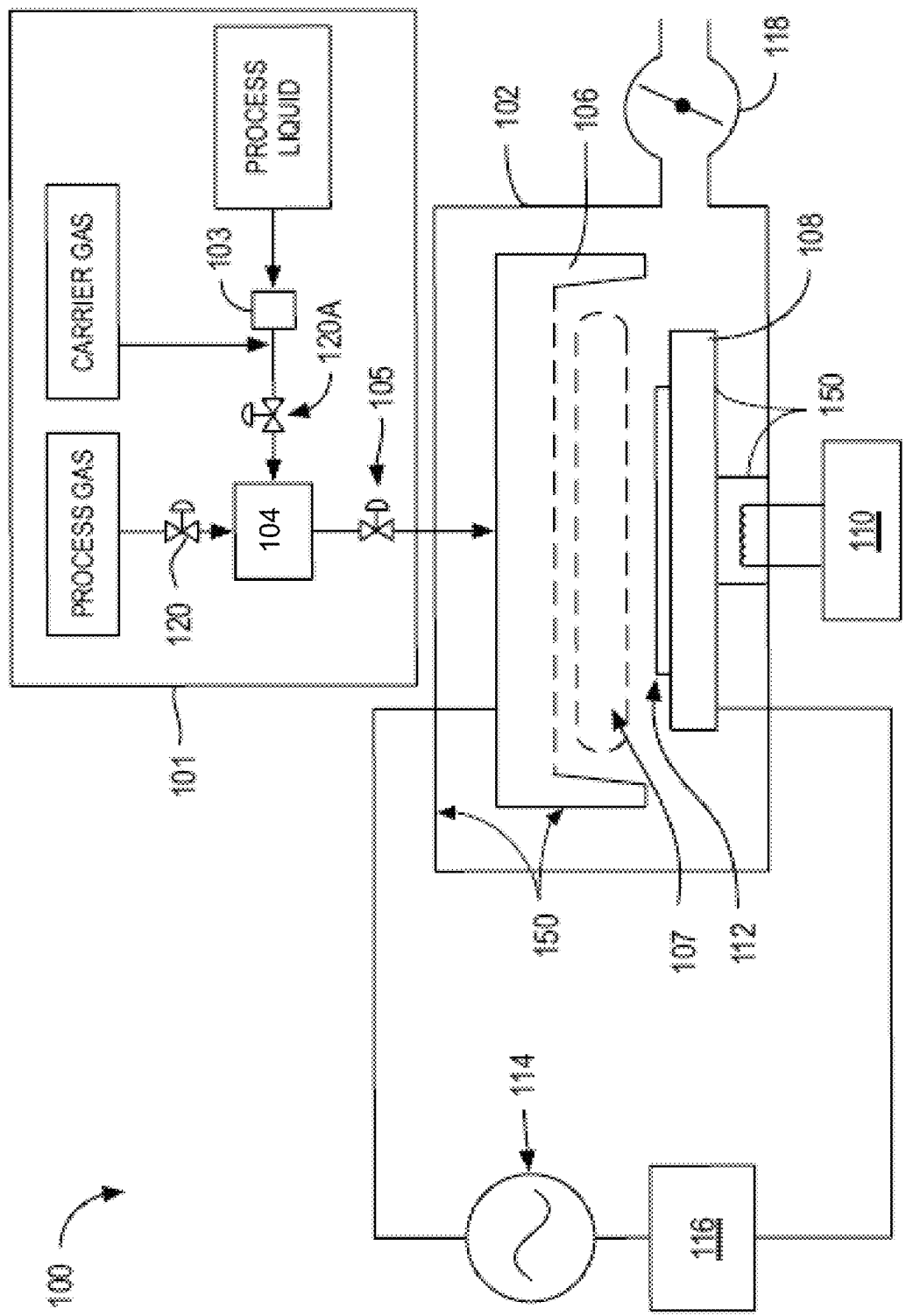
FIG. 1 depicts a substrate processing apparatus for depositing films on semiconductor substrates using any number of processes.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific implementations, it will be understood that these implementations are not intended to be limiting.

There are many concepts and implementations described and illustrated herein. While certain features, attributes and advantages of the implementations discussed herein have been described and illustrated, it should be understood that many others, as well as different and/or similar implementations, features, attributes and advantages of the present inventions, are apparent from the description and illustrations. As such, the below implementations are merely some possible examples of the present disclosure. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description below because the description of the above implementations has been presented for the purposes of illustration and description.

Importantly, the present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

Some semiconductor processes are used to deposit one or more layers of a material onto a substrate such as a wafer. When used herein, "wafer" can typically be interpreted to include other forms of "substrate" such as a large format display substrate. Examples of such deposition processes include chemical vapor deposition ("CVD"), plasma-enhanced CVD ("PECVD"), atomic layer deposition ("ALD"), low pressure CVD, ultra-high CVD, physical vapor deposition ("PVD"), and conformal film deposition ("CFD").

For instance, some CVD processes may deposit a film on a wafer surface by flowing one or more gas reactants into a reactor which form film precursors and by-products. The precursors are transported to the wafer surface where they are adsorbed by the wafer, diffused into the wafer, and deposited on the wafer by chemical reactions which also generate by-products that are removed from the surface and from the reactor.

For another example, some deposition processes involve multiple film deposition cycles, each producing a "discrete" film thickness. ALD is one such film deposition method, but any technique which puts down thin layers of film and used in a repeating sequential matter may be viewed as involving multiple cycles of deposition.

As device and features size continue to shrink in the semiconductor industry, and also as 3D devices structures become more prevalent in integrated circuit (IC) design, the capability of depositing thin conformal films (films of material having a uniform thickness relative to the shape of the underlying structure, even if non-planar) continues to gain importance. ALD is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying devices structure. In certain embodiments, each ALD cycle includes the following steps:
1. Exposure of the substrate surface to a first precursor.
2. Purge of the reaction chamber in which the substrate is located.
3. Activation of a reaction of the substrate surface, typically with a plasma and/or a second precursor.
4. Purge of the reaction chamber in which the substrate is located.

Figure 8:
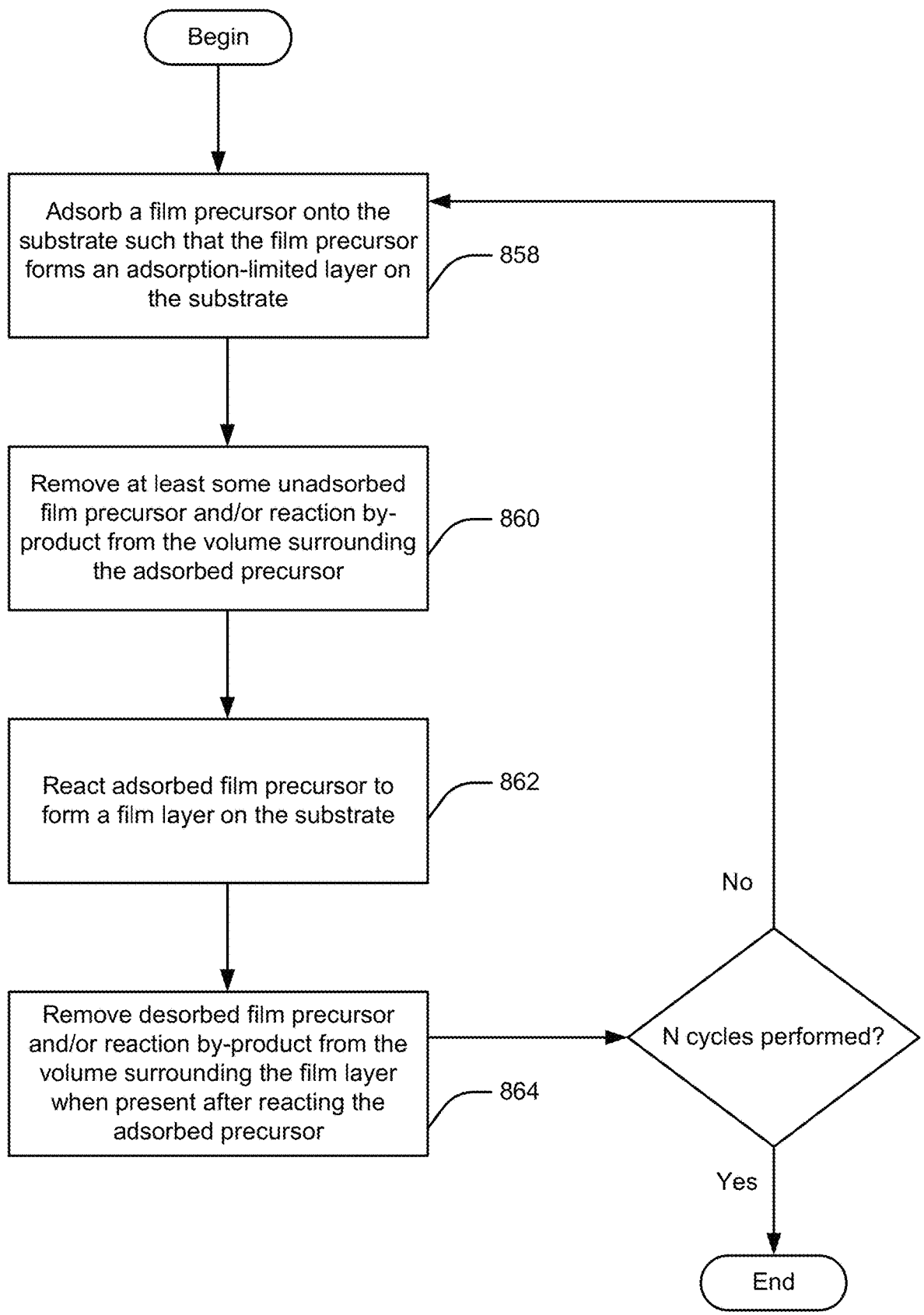
FIG. 8 depicts a flowchart of an example sequence of operations for forming a film of material on a substrate via an atomic layer deposition process.

The duration of each ALD cycle may typically be less than 25 seconds or less than 10 seconds or less than 5 seconds. The plasma exposure step (or steps) of the ALD cycle may be of a short duration, such as a duration of 1 second or less. FIG. 8 depicts a flowchart of an example sequence of operations for forming a film of material on a substrate via an ALD process. As can be seen in FIG. 8, item 1 above corresponds with block 858, item 2 above corresponds with block 860, item 3 above corresponds with block 862, and item 4 above corresponds with block 864; the four blocks are performed for N cycles, after which the process is stopped.

FIG. 1 shows a substrate processing apparatus for depositing films on semiconductor substrates using any number of processes. The apparatus 100 of FIG. 1 has a single processing chamber 102 with a single substrate holder 108 (e.g., a pedestal) in an interior volume which may be maintained under vacuum by vacuum pump 118. Also fluidically coupled to the chamber for the delivery of (for example) film precursors, carrier and/or purge and/or process gases, secondary reactants, etc. is gas delivery system 101 and showerhead 106. Equipment for generating a plasma within the processing chamber is also shown in FIG. 1. The apparatus schematically illustrated in FIG. 1 is commonly for performing ALD, although it may be adapted for performing other film deposition operations such as conventional CVD, particularly plasma enhanced CVD.

Figure 2:
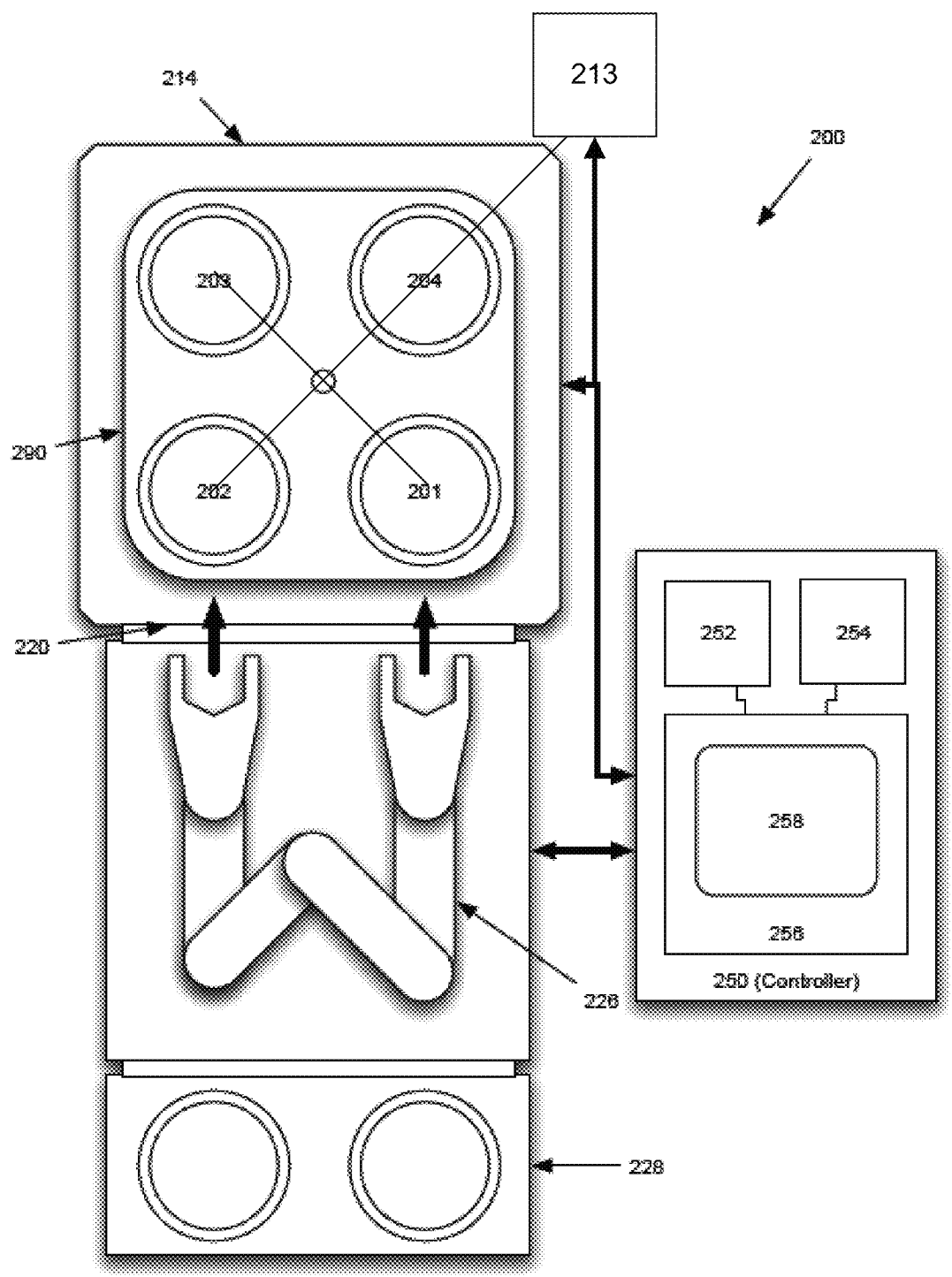
FIG. 2 depicts an implementation of a multi-station processing tool.

For simplicity, processing apparatus 100 is depicted as a standalone process station having a process chamber body 102 for maintaining a low-pressure environment. However, it will be appreciated that a plurality of process stations may be included in a common process tool environment—e.g., within a common reaction chamber—as described herein. For example, FIG. 2 depicts an implementation of a multi-station processing tool and is discussed in further detail below. Further, it will be appreciated that, in some implementations, one or more hardware parameters of processing apparatus 100, including those discussed in detail herein, may be adjusted programmatically by one or more system controllers.

Process station 100 fluidically communicates with gas delivery system 101 for delivering process gases, which may include liquids and/or gases, to a distribution showerhead 106. Gas delivery system 101 includes a mixing vessel 104 for blending and/or conditioning process gases for delivery to showerhead 106. One or more mixing vessel inlet valves 120 may control introduction of process gases to mixing vessel 104.

Some reactants may be stored in liquid form prior to vaporization and subsequent delivery to the process chamber 102. The implementation of FIG. 1 includes a vaporization point 103 for vaporizing liquid reactant to be supplied to mixing vessel 104. In some implementations, vaporization point 103 may be a heated liquid injection module. In some other implementations, vaporization point 103 may be a heated vaporizer. In yet other implementations, vaporization point 103 may be eliminated from the process station.

In some implementations, a liquid flow controller (LFC) upstream of vaporization point 103 may be provided for controlling a mass flow of liquid for vaporization and delivery to processing chamber 102.

Showerhead 106 distributes process gases and/or reactants (e.g., film precursors) toward substrate 112 at the process station, the flow of which is controlled by one or more valves upstream from the showerhead (e.g., valves 120, 120A, 105). In the implementation shown in FIG. 1, substrate 112 is located beneath showerhead 106, and is shown resting on a pedestal 108. Showerhead 106 may have any suitable shape, and may have any suitable number and arrangement of ports for distributing processes gases to substrate 112. In some implementations with two or more stations, the gas delivery system 101 includes valves or other flow control structures upstream from the showerhead, which can independently control the flow of process gases and/or reactants to each station such that gas may be flowed to one station but not another. Furthermore, the gas delivery system 101 may be configured to independently control the process gases and/or reactants delivered to each station in a multi-station apparatus such that the gas composition provided to different stations is different; e.g., the partial pressure of a gas component may vary between stations at the same time.

A volume 107 is located beneath showerhead 106. In some implementations, pedestal 108 may be raised or lowered to expose substrate 112 to volume 107 and/or to vary a volume of volume 107. Optionally, pedestal 108 may be lowered and/or raised during portions of the deposition process to modulate process pressure, reactant concentration, etc. within volume 107.

In FIG. 1, showerhead 106 and pedestal 108 are electrically connected to RF power supply 114 and matching network 116 for powering a plasma. In some implementations, the plasma energy may be controlled (e.g., via a system controller having appropriate machine-readable instructions and/or control logic) by controlling one or more of a process station pressure, a gas concentration, an RF source power, an RF source frequency, and a plasma power pulse timing. For example, RF power supply 114 and matching network 116 may be operated at any suitable power to form a plasma having a desired composition of radical species. Likewise, RF power supply 114 may provide RF power of any suitable frequency and power.

In some implementations with two or more stations, the apparatus is configured such that the RF power supply 114 and associated components ignite and sustain a plasma in each station independently. For example, the apparatus may be configured to maintain a plasma in one station while, at the same time, not forming a plasma in another station. Further, the apparatus may be configured to maintain a plasma in two stations, but with different plasma characteristics such as plasma power, density, composition, duration, etc.

In some implementations, the plasma ignition and maintenance conditions are controlled with appropriate hardware and/or appropriate machine-readable instructions in a system controller which may provide control instructions via a sequence of input/output control (IOC) instructions. In one example, the instructions for setting plasma conditions for plasma ignition or maintenance are provided in the form of a plasma activation recipe of a process recipe. In some cases, process recipes may be sequentially arranged, so that all instructions for a process are executed concurrently with that process. In some implementations, instructions for setting one or more plasma parameters may be included in a recipe preceding a plasma process. For example, a first recipe may include instructions for setting a flow rate of an inert (e.g., helium) and/or a reactant gas, instructions for setting a plasma generator to a power set point, and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of less than 50 milliseconds, with 25 milliseconds being a specific example.

As described above, one or more process stations may be included in a multi-station substrate processing tool. FIG. 2 shows an example multi-station substrate processing apparatus. Various efficiencies may be achieved through the use of a multi-station processing apparatus like that shown in FIG. 2 with respect to equipment cost, operational expenses, as well as increased throughput. For instance, a single vacuum pump may be used to create a single high-vacuum environment for all four process stations by evacuating spent process gases, etc. for all four process stations. Depending on the implementation, each process station may have its own dedicated showerhead for gas delivery, but may share the same gas delivery system. Likewise, certain elements of the plasma generator equipment may be shared amongst process stations (e.g., power supplies), although depending on the implementation, certain aspects may be process station-specific (for example, if showerheads are used to apply plasma-generating electrical potentials). Once again, it is to be understood that such efficiencies may also be achieved to a greater or lesser extent by using more or fewer numbers of process stations per processing chamber such as 2, 3, 5, 6, 7, 8, 9, 10, 11, 12, 13, 14, 15, or 16, or more process stations per reaction chamber.

The substrate processing apparatus 200 of FIG. 2 employs a single substrate processing chamber 214 that contains multiple substrate process stations, each of which may be used to perform processing operations on a substrate held in a wafer holder, e.g., a pedestal, at that process station. In this particular implementation, the multi-station substrate processing apparatus 200 is shown having four process stations 201, 202, 203, and 204. Other similar multi-station processing apparatuses may have more or fewer processing stations depending on the implementation and, for instance, the desired level of parallel wafer processing, size/space constraints, cost constraints, etc. Also shown in FIG. 2 are a substrate handler robot 226 and a controller 250.

As shown in FIG. 2, the multi-station processing tool 200 has a substrate loading port 220, and a robot 226 configured to move substrates from a cassette loaded through a pod 228 through atmospheric port 220, into the processing chamber 214, and onto one of the four stations 201, 202, 203, or 204.

The depicted processing chamber 214 shown in FIG. 2 provides four process stations, 201, 202, 203, and 204. The RF power is generated at an RF power system 213 and distributed to each of the stations 201, 202, 203, and 204. The RF power system may include one or more RF power sources, e.g., a high frequency (HFRF) and a low frequency (LFRF) source, impedance matching modules, and filters. In certain implementations, the power source may be limited to only the high frequency or low frequency source. The distribution system of the RF power system may be symmetric about the reactor and may have high impedance. This symmetry and impedance result in approximately equal amounts of power being delivered to each station. As stated above, in some implementations the RF power system may be configured to independently deliver power to each station. For example, RF power may be delivered simultaneously to stations 201 and 202, and at the same time not delivered to stations 203 and 204, such that a plasma is simultaneously formed and maintained only in stations 201 and 202.

FIG. 2 also depicts an implementation of a system controller 250 employed to control process conditions and hardware states of process tool 200 and its process stations. System controller 250 may include one or more memory devices 256, one or more mass storage devices 254, and one or more processors 252. Processor 252 may include one or more CPUs, ASICs, general-purpose computer(s) and/or specific purpose computer(s), one or more analog and/or digital input/output connection(s), one or more stepper motor controller board(s), etc.

In some implementations, system controller 250 controls some or all of the operations of process tool 200 including the operations of its individual process stations. System controller 250 may execute machine-readable system control instructions 258 on processor 252; the system control instructions 258, in some implementations, loaded into memory device 256 from mass storage device 254. System control instructions 258 may include instructions for controlling the timing, mixture of gaseous and liquid reactants, chamber and/or station pressure, chamber and/or station temperature, wafer temperature, target power levels, RF power levels, RF exposure time, substrate pedestal, chuck, and/or susceptor position, plasma formation in each station (which, as discussed above, may include independent plasma formation in one or more stations), flow of gaseous and liquid reactants (which, as stated above, may include independent flow to one or more stations) and other parameters of a particular process performed by process tool 200. These processes may include various types of processes including, but not limited to, processes related to deposition of film on substrates. System control instructions 258 may be configured in any suitable way. For example, various process tool component subroutines or control objects may be written to control operation of the process tool components. System control instructions 258 may be coded in any suitable computer readable programming language. In some implementations, system control instructions 258 are implemented in software, in other implementations, the instructions may be implemented in hardware—for example, hard-coded as logic in an ASIC (application specific integrated circuit), or, in other implementations, implemented as a combination of software and hardware.

In some implementations, system control software 258 may include input/output control (IOC) instructions for controlling the various parameters described above. For example, each step of a deposition process or processes may include one or more instructions for execution by system controller 250. The instructions for setting process conditions for a primary film deposition process, for example, may be included in a corresponding deposition recipe, and likewise for a capping film deposition. In some implementations, the recipes may be sequentially arranged, so that all instructions for a process are executed concurrently with that process.

Other computer-readable instructions and/or programs stored on mass storage device 254 and/or memory device 256 associated with system controller 250 may be employed in some implementations. Examples of programs or sections of programs include a substrate positioning program, a process gas control program, a pressure control program, a heater control program, and a plasma control program.

In some implementations, there may be a user interface associated with system controller 250. The user interface may include a display screen, graphical software displays of the apparatus and/or process conditions, and user input devices such as pointing devices, keyboards, touch screens, microphones, etc.

In some implementations, parameters adjusted by system controller 250 relate to process conditions. Non-limiting examples include process gas compositions and flow rates, temperatures, pressures, plasma conditions (such as RF bias power levels, frequencies, exposure times), etc. Additionally, the controller may be configured to independently control conditions in the process stations, e.g., the controller provides instructions to ignite a plasma in some but not all stations. These parameters may be provided to the user in the form of a recipe, which may be entered utilizing the user interface.

Signals for monitoring the processes may be provided by analog and/or digital input connections of system controller 250 from various process tool sensors. The signals for controlling the processes may be output on the analog and/or digital output connections of process tool 200. Non-limiting examples of process tool sensors that may be monitored include mass flow controllers (MFCs), pressure sensors (such as manometers), thermocouples, load sensors, OES sensors, metrology equipment for measuring physical characteristics of wavers in-situ, etc. Appropriately programmed feedback and control algorithms may be used with data from these sensors to maintain process conditions.

System controller 250 may provide machine-readable instructions for implementing deposition processes. The instructions may control a variety of process parameters, such as DC power level, RF bias power level, station-to-station variations such as RF power parameter variations, frequency tuning parameters, pressure, temperature, etc. The instructions may control the parameters to operate in-situ deposition of film stacks according to various implementations described herein.

The system controller will typically include one or more memory devices and one or more processors configured to execute machine-readable instructions so that the apparatus will perform operations in accordance with the processes disclosed herein. Machine-readable, non-transitory media containing instructions for controlling operations in accordance with the substrate doping processes disclosed herein may be coupled to the system controller.

As mentioned above, processing multiple substrates at multiple process stations within a common substrate processing chamber may increase throughput by enabling film deposition to proceed in parallel on multiple substrates while at the same time utilizing common processing equipment between the various stations. For instance, in a four-station process chamber, four substrates placed in four separate stations may be processed at the same time. It should be noted that some multi-station substrate processing tools may be utilized to simultaneously process wafers for an equal number of cycles (e.g., for some ALD processes). Given this configuration of process stations and substrate loading and transferring devices, a variety of process sequences are possible which allow film deposition—say, for instance, N cycles of film deposition for an ALD process or an equal exposure duration for a CVD process—to occur in parallel (e.g., simultaneously) across multiple substrates.

Approaches to achieving consistent film deposition across different substrates include indexing a substrate through multiple process stations within the processing chamber over the course of a deposition process—i.e., for each substrate, some portion of its film is deposited at one station, and some portion at one or more other processing stations. This may result in an averaging-out of any systematic difference in deposition occurring at the different stations. Again, this processing mode may be used for any type of deposition process including, for instance, CVD and ALD. For example, in an ALD process for which a total of N cycles are to be performed on four wafers in a four-station processing chamber, N/4 cycles may be performed on each wafer in each station, with each wafer being transported to a different station after the completion of each of the N/4 cycles. On the other hand, some other implementations of this approach may not perform an equal number of cycles on each wafer. For another example, in an ALD process for which a total of N cycles are to be performed on four wafers in a four-station processing chamber, N×⅖ cycles may be performed on each wafer in the station in which each wafer is initially placed, followed by N/5 cycles performed each wafer in the other three remaining stations. By way of illustration, 500 total deposition cycles may be performed on wafers 1, 2, 3, and 4, which are initially placed in stations 201, 202, 203, and 204, respectively. 200 cycles are performed on wafer 1 in station 201, after which wafer 1 is then transferred to stations 202, 203, and 204 where 100 cycles are performed on wafer 1 in each of these stations, respectively, thereby totaling 500 total cycles. The same approach is applied to wafers 2, 3, and 4.

This type of "sequential mode" processing or "sequential processing" is beneficial in the sense that each wafer sees a different station which may average-out some of the systematic differences in deposition occurring at the different stations. However, other characteristics of this mode of operation make it less appealing. For example, some implementations of sequential mode involve a great deal of substrate loading/unloading, opening/closing of processing chamber port 220. In some modes of operation, for a substrate to receive its allotted N depositions over the 4 stations, the processing chamber has to be opened and closed for loading/unloading operations 4 times, each time accompanied by restoration of the environment on chamber's interior back to deposition-appropriate environmental conditions (e.g., temperature, pressure, flow rates, etc.). "Static mode," when using one station for loading operations, may involve the same amount of indexing—using 90 degree transfer rotations of a cassette on which the wafers are located within the process chamber—to get 4 wafers into position for deposition, but the chamber is only opened and closed once since in static mode no intervening depositions are performed between the transfer rotations. Thus, loading of all four wafers (one by one) into the multi-station chamber prior to deposition is also possible. Even when the chamber remains closed and the internal pressure remains relatively static, the indexing of wafers from one station to the next delays processing.

Another process sequence, referred to herein as "fixed mode" involves no indexing. In fixed mode, using the example of FIG. 2, the chamber is opened via port 220, wafers are loaded at all four stations, the chamber is closed, N deposition cycles are performed on all four wafers in parallel and simultaneously, the deposition cycles conclude, the chamber is opened, and the four wafers are removed. In other words, each substrate receives its film deposition entirely (all N cycles) at one of the four processing stations. This fixed mode processing may be used for any type of deposition process including, for example, CVD and ALD. Fixed mode processing does not have the delay associated with indexing in other modes, so deposition throughput is higher. However, this mode may not always achieve consistent film deposition between the different substrates due to process mismatch between the different stations. For instance, the process conditions in one station may not exactly match the process conditions in another station, such as different RF frequencies between stations, which may result in a wafer processed in the one station having different properties than a wafer processed in another station. The mismatch between wafers may include, for example, differences in average film thickness, uniformity over the face of wafer, physical properties, chemical properties, and optical properties.

Techniques for improving the wafer mismatch between stations, i.e. achieving more consistent film deposition across different substrates, in a multi-station process chamber include designing the semiconductor processing equipment in a way that minimizes the differences in process conditions between stations. For example, as noted above, station-to-station thickness matching is a problem in multi-station process chambers and this station-to-station thickness may vary because of differences in numerous process conditions between stations, such as gas and/or chemistry delivery, RF power delivered to each station, temperature of each station, pumping within the chamber and/or each station, hardware settings (e.g., placement and function of the station hardware), and the physical environment within the chamber. Aspects of the multi-station process chamber may be designed and/or built to minimize the differences of these process conditions between each station (e.g., identical temperature profiles at each station), but such design in complex and it is nearly impossible to reduce them completely.

Another technique to improve the wafer mismatch between stations in a multi-station process chamber includes adjusting one or more process conditions at one or more stations. However, most process conditions in a deposition process are typically dependent upon one another such that if process condition A is adjusted to compensate for the difference in process condition B, such adjustment may unintentionally impact the effects of process condition C. For example, the temperature in one or more stations may be adjusted to improve thickness-matching between stations, but this change in temperature may also impact film stress. Therefore, adjusting one or more process conditions at one or more stations is a very complex optimization problem that involves highly cross-correlated variables.

As mentioned above, station-to-station thickness matching can be a problem in multi-station process chambers operated in fixed mode. The inventors have determined that station-to-station thickness matching (and other forms of uniformity) may be improved by operating one or more stations normally to deposit a layer of material on a wafer in one station, while simultaneously slowing or stopping the normal operation of one or more other stations such that deposition of a layer on another wafer in the one or more other stations of the multi-station process chamber is slowed or stopped. As discussed below, as an alternative to slowing or stopping the normal operations in one or more stations, the process may simply adjust deposition conditions in those stations, while maintaining normal conditions in the other stations. Examples of deposition conditions that may be adjusted to provide different conditions in different stations include, among other things, plasma ignition timing, plasma power, duration of the plasma, flow of process gases (e.g., reactant and/or precursor), and partial pressure of process gases. The apparatuses and techniques in this disclosure may apply to any deposition processes, including those described above, such as CVD, PECVD, ALD, and ECD.

Figure 3:
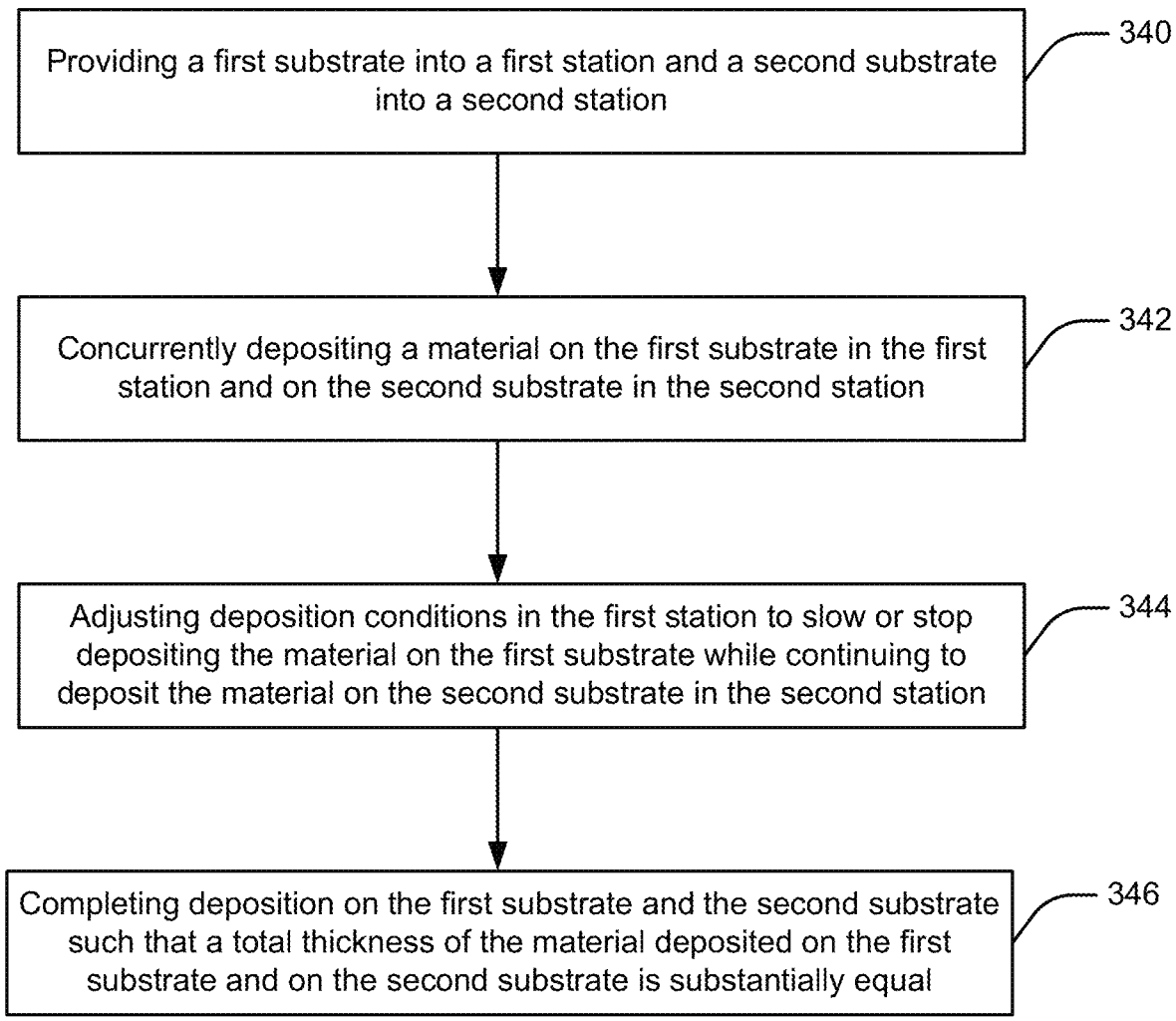
FIG. 3 depicts a flowchart for a first example technique for depositing approximately equal thicknesses of a material on at least two substrates concurrently processed in separate stations of a multi-station deposition apparatus.

FIG. 3 depicts a flowchart for a first example technique for depositing approximately equal thicknesses of a material on at least two substrates concurrently processed in separate stations of a multi-station deposition apparatus. Such deposition may be performed by, for instance, CVD or ALD. Although this first example illustrates a technique that involves two stations, such technique may be applied to a multi-station deposition apparatus with more than two stations, including the apparatuses described above with respect to FIGS. 1 and 2. In block 340 of FIG. 3, substrates are provided into the stations of a multi-station deposition apparatus. A first substrate may be provided into a first station and a second substrate may be provided into a second station. As discussed above with reference to FIG. 2, the substrates may be placed into the stations by a substrate handler robot.

In block 342 of FIG. 3, a material is concurrently deposited on the first substrate in the first station and on the second substrate in the second station. As stated, this deposition occurs concurrently, i.e., simultaneously or in parallel, in the stations such that the deposition is occurring on first substrate in the first station at the same time as the deposition on the second substrate in the second station. The concurrent deposition in block 342 may be a single CVD deposition process, a single deposition cycle in a cyclic deposition process like ALD, or the total deposition process of a cyclic process. During such concurrent deposition, the deposition conditions in the first and second stations may be substantially the same; e.g., the control system sets parameters intended to produce identical (or nearly identical) conditions in the stations. For certain process parameters (e.g., plasma power, process gas flow rate), the parameters in the different stations may be within a few percent, e.g., within +/-5%, of each other. As discussed above, attempts may be made to create identical process conditions in each station but one or more process conditions across stations often do not match exactly. These deposition conditions may include, for example and as noted above, temperature of a pedestal in each station, partial pressure of a gas flowed into each station, local gas flow conditions, pressure in the chamber, plasma power in each station, plasma frequency, and plasma formation duration in each station (for depositions that involve plasma). As a result, the concurrent deposition may produce a thicker layer of the material on the first substrate in the first station than on the second substrate in the second station despite efforts to produce equal layers of the material on each substrate. For example, in an ALD process, the thicker layer of the material may be the total thickness of the material deposited on the substrate after performing N cycles, or it could be the thickness of the material after a single cycle.

Determining that two or more stations of a chamber deposit material to different thicknesses may be accomplished by various techniques. It may be inferred from device performance or measured directly. As understood by those of skill in the art, measuring the difference of material layer thickness between two substrates can be performed by any number of techniques including any known metrology technique, such as reflectometry, various microscopies, etc. Because the deposited thicknesses produced in each station may not typically vary between deposition processes until after a certain period of time or a certain number of deposition cycles, these measured thicknesses may be considered the thicknesses consistently produced by each station for each process, which may be stored in a memory and/or used for later aspects of the technique, as discussed below. In another example, the thickness of the layer of material on each substrate may be measured in situ, i.e., while a wafer is in the station and/or chamber before, during, and/or after the deposition process.

In block 344, one or more adjustments are made to the deposition conditions in the first station to slow or stop deposition of the material on the first substrate, while the apparatus continues to deposit the material on the second substrate in the second station under the conditions in block 342. Each adjustment of each deposition condition that is adjusted may depend on numerous factors, including the deposition process being utilized as well as the thickness of the material that is to be deposited in each station, if any. The adjustments may, for example, include reducing or stopping the flow of reactant, e.g., precursor, into the first station. For instance, in a CVD process that began deposition on the two substrates using a particular set of substantially identical initial deposition conditions, the adjustment may be to stop the flow of a reactant into the first station in order to stop and/or slow the deposition in the first station while the deposition conditions in the second station may continue under the initial deposition conditions. In another example, the adjustment in a cyclic deposition process, such as ALD, according to initial, substantially identical deposition conditions may be to stop the flow of precursor to the first station for an adsorption stage of one cycle of the process such that no material is deposited on the first substrate during that one cycle, but during that same one cycle, the precursor is flowed to the second station according to the initial deposition conditions such that deposition occurs in the second station.

As noted above, in some embodiments, the adjustment may be to change the deposition conditions in the first station in order to change the characteristics of the layer produced by that deposition process. This change in characteristics may be considered a stopping or slowing of the deposition process.

For deposition processes using plasma exposure in the first and second stations, adjustment may be made to the plasma conditions in the first station. For instance, similar to the precursor flow, the adjustment in block 344 may be to reduce or stop the exposure of the first substrate to the plasma which may in turn slow or stop the deposition process on the first substrate. This adjustment may be achieved by, among other things, stopping the formation of the plasma in the first station, changing the plasma frequency, changing the power level of the plasma in the first station, and/or changing the time for which the plasma is formed in the first station. In an ALD process, the adjustments may be made from one cycle to the next. For example, a plasma may be ignited in each of 100 cycles and then not ignited for each of thirteen cycles. In other processes that are inherently non-cyclic, the adjustments are made at a particular point in the deposition process without regard for defined process transitions. For example, in a PECVD process, the plasma exposure in the first station may be stopped after a defined duration while the plasma exposure in the second station continues under the initial deposition conditions. As an alternative to simply turning power off, other plasma conditions may be adjusted to tune the deposition rate. For instance, the plasma power level in the first station may be reduced in order to slow the deposition process in the first station and the plasma power level in the second station may continue under the initial deposition conditions.

Figure 4:
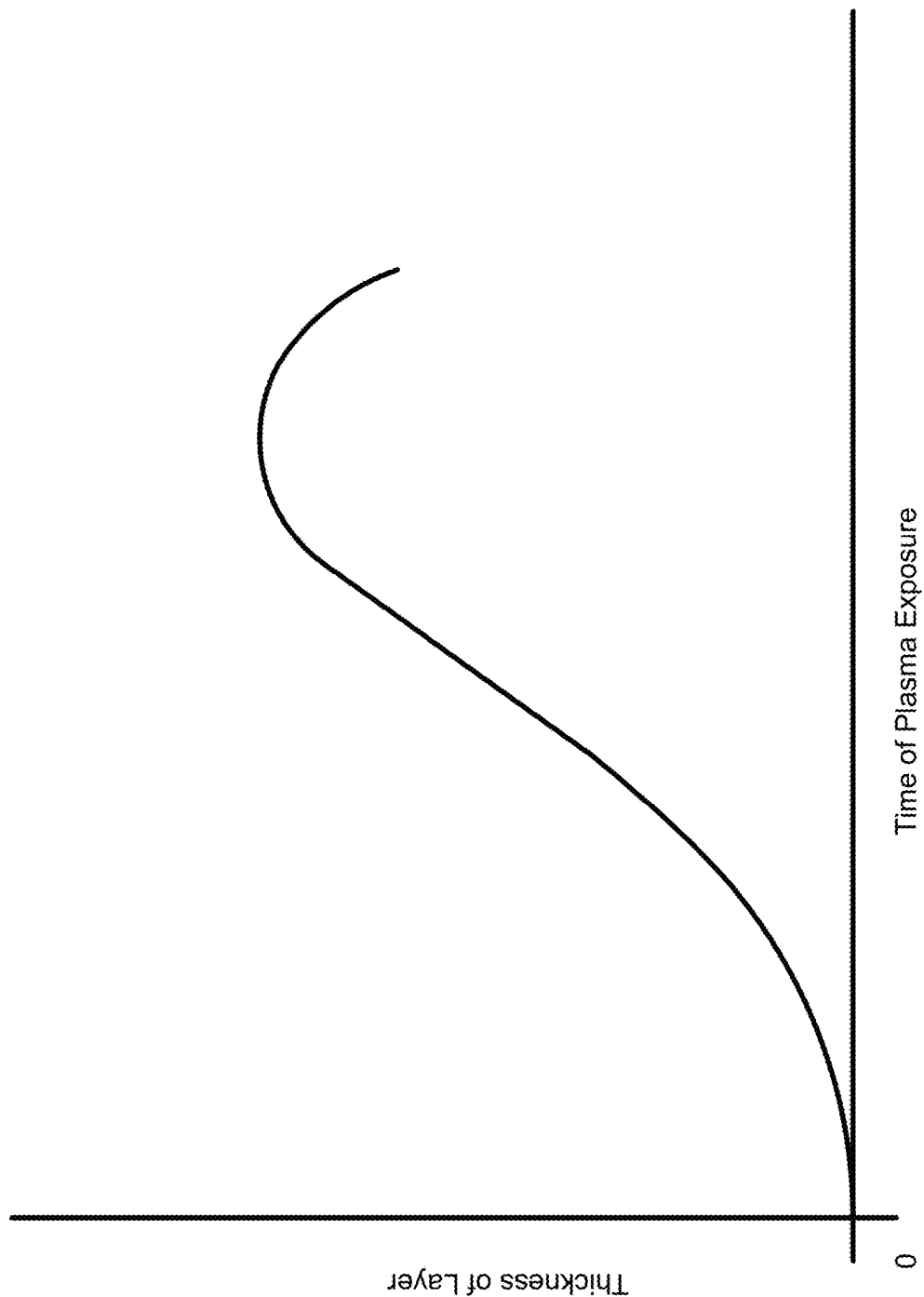
FIG. 4 depicts a graph showing a general relationship between plasma exposure time and thickness of a material formed by the plasma.

Regarding adjustment of the time for which the plasma is formed in the first station, such adjustment may be an increase or decrease of that time which may in turn increase or decrease the thickness of the layer of material. FIG. 4 depicts a graph showing a general relationship between plasma exposure time and thickness of a material formed by the plasma. As can be seen, the thickness of the layer initially increases as the time of plasma exposure increases, after which a maximum thickness is reached, but as plasma exposure continues after that maximum is reached, the layer is caused to densify and therefore decrease in thickness. Accordingly, this relationship between time of plasma exposure and thickness of the layer may be used in the adjustment of the deposition conditions in order to change the deposition of the wafer in the first station such that, for example, the deposition rate of the layer in the first station may be "reduced", i.e. the thickness is decreased by additional exposure time to the plasma.

Referring back to FIG. 3, in some implementations block 342 may include a cyclic repetition of (i) precursor dosing to absorb precursor on the first and second substrates, and (ii) exposing the first and second substrates to plasma to cause the precursor to react to form the material. Such a cyclic repetition may be an ALD process as described herein and shown, for example, in FIG. 8. In some such implementations, after a certain number of cyclic depositions, an overall thickness of the layer of the material on the first wafer may be greater than the overall thickness of the layer of the material on the second wafer, as noted above with block 342. Therefore, in block 344, adjustments to the deposition conditions of one or more cycles in the first station may be made. In some implementations, these adjustments may include stopping the precursor dosing and/or the plasma exposure in the first station in order to reduce the thickness of the material deposited during the cyclic repetitions, while continuing to conduct the cyclic repetitions on the second substrate in the second station under the conditions in block 342. As used herein "reduce" may be a layer having a reduced or decreased thickness, or may be a layer having no thickness, i.e., no layer is produced during the cycles for which the adjustments are made. In some other implementations, these adjustments may include changing the duration of plasma exposure or power of the plasma in the first station in order to reduce the thickness of the material deposited during the cyclic repetitions, while continuing to conduct the cyclic repetitions on the second substrate in the second station under the conditions in block 342. Like above, this reduction may include a layer having a reduced thickness or that no layer is produced during the cycles for which the adjustments are made.

In some implementations, the first wafer does not move from the first station during blocks 342 and 344. Therefore, as the deposition is continued in the second station under the deposition conditions, the first wafer remains in the first station. For instance, these implementations may be considered a "fixed mode".

In block 346, the deposition may be completed on the first substrate in the first station and the second substrate in the second station such that a total thickness of the material deposited on the first substrate and on the second substrate is substantially equal for purposes of the performance of the resulting integrated circuit or other fabricated device. The adjustment(s) in block 344 enable the deposition of the layer of material on the second substrate in the second station to increase while the deposition on the first wafer is either stopped, slowed, or otherwise changed in order to cause the thickness of the layer of material on the second substrate to become substantially equal to the thickness of the layer of material on the first substrate by the end of the total deposition process.

It should be noted that the adjustment of the deposition conditions may occur at any point during the technique, such as at the beginning, middle, end, or interspersed throughout the deposition process. For instance, in an ALD process that includes 500 concurrent deposition cycles in the first and second stations, the adjustment of block 344 may be made after the 500 cycles such that for N deposition cycles after all the 500 cycles, no deposition occurs on the first wafer but deposition of the layer of material does occur on the second wafer in the second station for the N cycles.

Figure 5:
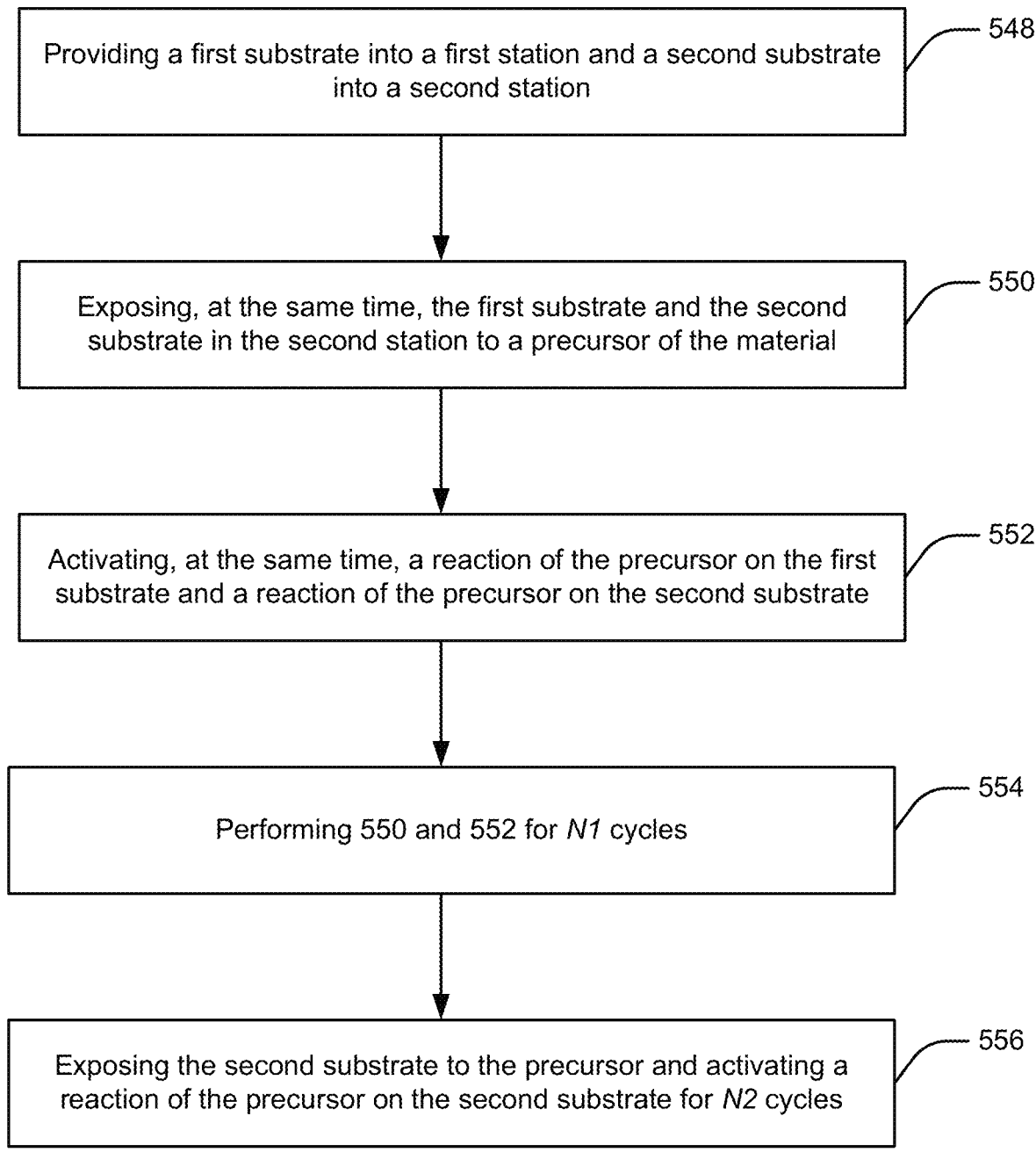
FIG. 5 depicts a flowchart for a second example technique for creating approximately equal thicknesses of a material on at least two substrates concurrently processed in separate stations of a multi-station deposition apparatus.

FIG. 5 depicts a flowchart for a second example technique for creating approximately equal thicknesses of a material on at least two substrates concurrently processed in separate stations of a multi-station deposition apparatus. As described herein, the second example technique may be used for cyclic deposition processes such as ALD or as depicted in FIG. 8. Block 548 may be the same as block 340 of FIG. 3 as discussed above, which provides a first substrate in a first station and a second substrate in a second station of the deposition apparatus. As also noted above with FIG. 3, the second example technique may be applied to a multi-station deposition apparatus having more than two stations and using the apparatus described herein, such as with respect to FIGS. 1 and 2. In block 550, the first substrate and the second substrate are exposed, at the same time (or substantially the same time), to a precursor of the material. This block may be considered a "dose" phase of a cyclic deposition process, such as block 858 in FIG. 8 for an ALD process. This exposure, or dose, occurs at the same time in each station such that the precursor flows into each station at substantially the same time for substantially the same duration, e.g., identical to within about +/−5% of each other. Although not depicted in FIG. 5, in some implementations a purge step may occur after block 550 and before block 552, as described above with respect to ALD processes and shown in block 860 of FIG. 8.

In block 552, the reaction of the precursor on the first substrate in the first station and on the second substrate in the second station is activated. In some implementations, this activation is performed thermally upon contact with a reactant, such as a reactant gas, while in other implementations it is performed by exposure to a plasma. As with block 550, the activation in each station occurs at the same time, or substantially the same time (e.g., within about +/−5% of each other). For instance, if the activation is with a plasma, then the activation of block 552 is performed by forming the plasma at substantially the same time in each station for substantially the same duration. Additionally, the deposition conditions of such activation may be substantially equal in each station. The activation of the reaction of the precursor causes, at least in part, the formation of the layer of the material on each substrate.

Block 554 provides that blocks 550 and 552 are performed for N1 cycles. In each of the N1 cycles, a thin film of substantially equal thickness t1 of the material may be deposited on the first substrate and a thin film of substantially equal thickness t2 of the material may be deposited on the second substrate. Additionally, performing the N1 cycles may create a total deposition thickness T1 of the material on the first substrate and a total deposition thickness T2A of the material on the second substrate. In some implementations, T1 is greater than T2A, which is similar to the first technique of FIG. 3.

Block 556 includes exposing the second substrate in the second station to the precursor and activating a reaction of the precursor on the second substrate in the second station for N2 cycles. Each of the N2 cycles may include depositing a thin film of substantially equal thickness t2 of the material on the second substrate. In each of the N2 cycles, the first substrate may remain in the first station and the deposition of a layer of the material on the first substrate may be stopped or slowed. Performing N2 cycles may create a total deposition thickness T2B and performing N1 and N2 cycles on the second substrate creates a total deposition thickness T2 (e.g., T2A+T2B) such that T2 is substantially equal to T1. In some implementations, T2B may substantially equal to t2, which may occur when N2 cycles is one cycle. For example, in an ALD process utilizing plasma to activate the reactions, each N2 cycle of block 556 may include exposing the second substrate in the second station with the precursor, forming a plasma in the second station to activate the reaction of the precursor on the second substrate, and at the same time not forming a plasma in the first station such that no deposition of the layer of the material may occur on the first substrate. In some implementations, block 556 may also include exposing the first substrate in the first station to the precursor, but not activating the reaction of the precursor on the first substrate.

Although FIG. 5 includes block 556 at the bottom of the Figure, block 556 may be performed at any time throughout the entire deposition process. For instance, block 556 may be performed before blocks 550, 552 and 554. In another instance, the N2 cycles of block 556 may be broken up and performed at different times throughout the N1 cycles. For example, for a deposition process involving 500 N1 cycles and 100 N2 cycles, the cycle order may be as follows: 100 N1 cycles, then 50 N2 cycles, then 200 N1 cycles, then 50 N2 cycles, and then 200 N1 cycles.

In some implementations, as discussed herein below, adjustments may be made to the deposition conditions of the first and/or second stations for each of the N2 cycles. For example, in some implementations of the second example technique for creating approximately equal thicknesses of a material on at least two substrates concurrently processed in separate stations of a multi-station deposition apparatus depicted in FIG. 5, the activation of the reaction of the precursor may be performed by a plasma. In such implementations, a plasma may be independently provided, e.g., ignited and controlled, in each station such that the plasma may be formed in one station while at the same time the plasma may not be formed in another station. In block 552, the activation may include independently providing the plasma to each station for a first plasma time and at a first plasma power. The first plasma time, i.e., duration for which the plasma is formed in the station, may vary depending on the deposition process involved, but may be 1 second or less. The first plasma power may be the power at which the plasma is generated, and may be correlated with RF power and/or RF frequency delivered to each station.

In block 556, the activation of the reaction of the precursor in the second station may include independently igniting and/or controlling a plasma in the second station. At the same time, the plasma may not be provided to the first station, or the plasma may be provided to the first station in such a way as to slow the deposition of the layer of material on the first substrate.

In some implementations, the activating in block 556 may include providing the plasma in the second station for a second plasma time that is different than the first plasma time. As discussed above with reference to FIG. 4, the duration over which a plasma is formed in each N2 cycle may cause the thickness of the layer of material deposited on the second wafer to be less or more than the thickness of the layer of material deposited in each N1 cycle of block 554. Therefore, the thin film of equal thickness t2 deposited in each N1 cycle of block 554 may be different than, e.g., less than or greater than, the thin film of equal thickness t2 deposited in each N2 cycle. The ability to produce films of two different thicknesses per cycle in and across stations enhances the ability to match station-to-station thickness.

In some implementations, the activating in block 556 may include providing the plasma in the second station at a second plasma power level that is different than the first plasma power level. Similar to above, the different power level in each N2 cycle may cause the thickness of the layer of material deposited on the second wafer to be less or more than the thickness of the layer of material deposited in each N1 cycle of block 554. Accordingly, the thin film of equal thickness t2 deposited in each N1 cycle of block 554 may be greater than or less than the thin film of equal thickness t2 deposited in each N2 cycle.

In some implementations, the exposure of block 550 may include flowing a precursor for a first exposure time to the first station and the second station. Additionally, the exposure in block 556 may include flowing a precursor for a second exposure time to the second station. As with the differing plasma power and plasma duration, exposing the second substrate to the precursor for the second exposure time may cause the deposition of a layer of the material in each N2 cycle that may have a thickness more than or less than the thickness of the layer of material deposited in each N1 cycle. For instance, the first exposure time may be a time that enables maximum adsorption of the precursor and the second exposure time may be 25% less than the first exposure time, which may thus cause the thickness of the layer deposited as a result of the first exposure time to be greater than the thickness of the layer deposited as a result of the second exposure time.

In some implementations, the exposure of block 550 may include flowing a precursor with a first partial pressure to the first station and the second station. Additionally, the exposure in block 556 may include flowing a precursor with a second partial pressure to the second station. As with the differing plasma power and plasma duration, exposing the second substrate to the precursor with the second partial pressure may deposit a layer of the material in each N2 cycle that may have a thickness more or less than the thickness of the layer of material deposited in each N1 cycle.

Accordingly, the permissible implementations of the first and/or second example techniques for creating approximately equal thicknesses of a material on at least two substrates concurrently processed, using cyclic deposition processes, in separate stations of a multi-station deposition apparatus discussed herein may increase the overall thickness of the layer of the material deposited on the second substrate by, at least: (i) the deposition of additional thin films of substantially equal thickness t2 of the material on the second substrate for N2 cycles according to the deposition conditions of the N1 cycles such that the thin film thickness t2 deposited in each of the N1 cycles and each of the N2 cycles are substantially equal, and/or (ii) the deposition of additional thin films of substantially equal thickness t2 of the material on the second substrate for N2 cycles according to deposition conditions, e.g. different plasma power or duration, that are different than the deposition conditions of the N1 cycles such that the thin film thickness t2 deposited in each of the N1 cycles is different that the thin film thickness t2 deposited in each of the N2 cycles.

In some implementations of the first and/or second example techniques for creating approximately equal thicknesses of a material on at least two substrates concurrently processed in separate stations of a multi-station deposition apparatus discussed herein, information, such as measurement data, about physical characteristics that exist on the wafers in the multi-station deposition apparatus for deposition and/or regarding the relative deposition rates in the first and second stations may be analyzed and/or used to determine the optimal adjustment or adjustments to the depositions conditions in the second station. In some such implementations, for instance, such measurement information may be "feed forward" measurement information, in some other such implementations, for example, such information may be "feedback" measurement information, and in some implementations, such measurement information includes both "feed forward" and "feedback" measurement information.

In some implementations using "feed forward" measurement information, information, such as information about physical characteristics that exist on the wafers in the multi-station deposition apparatus for deposition and/or regarding the relative deposition rates in the first and second stations, may be obtained and/or known before deposition occurs on the wafer, which may include before the wafer is placed in the multi-station deposition apparatus for deposition or after the wafer is placed in the multi-station deposition apparatus but before deposition occurs. For example, the "feed forward" measurement information may be measurement data of each wafer that is obtained by metrology equipment, e.g., in situ or in line, which may be obtained before and/or after the wafer has been placed in the multi-station deposition apparatus. This "feed forward" measurement information may be sent directly to the multi-station deposition apparatus controller that includes control logic for determining the appropriate adjustments for each of the N2 deposition cycles. The "feed forward" measurement information may also be provided to a user who may then input the appropriate adjustments into the multi-station deposition apparatus, such as to the controller through the user interface. Such adjustments may be those adjustments discussed herein, including plasma power, plasma duration, and numbers of N2 cycles.

For example, wafers may be provided into the multi-station deposition apparatus after having been processed in some other fashion, such as a previous etching process. In such example, known data (e.g., measurement data obtained from in-situ, in-line, or previous measurements as described above) of the physical characteristics of the wafer to be placed in and processed by the multi-station deposition apparatus from the previous etching process may be fed forward to determine the optimal deposition conditions to appropriately deposit material and thus match the individual features on the wafer in the second station. FIG. 6 depicts a chart of an example implementation using feed forward information. The example implementation is for a multi-station deposition apparatus with stations 1-4 and wafers 1-4 placed in stations 1-4, respectively. The four wafers have been previously etched such that a critical dimension ("CD"), i.e. a resulting distance between each gap formed by the etch process, is known for each wafer prior to the deposition process and as can be seen, the incoming, pre-deposition CD for each wafer varies. Here, an ALD process is desired to deposit material into the etched gaps such that the final CD is less than the CD immediately after etching. However, because of the CD variations after the etch process, a uniform ALD deposition may cause the variations to remain after the ALD depositions. For instance, a uniform deposition of 100 Å to wafers 1,2,3, and 4 would create an output CD of 220 Å, 222 Å, 224 Å, and 226 Å, respectively.

Utilizing the "feed forward" measurement information, the deposition conditions in one or more of the four stations may be adjusted such that each station deposits a layer that causes the final CD to be the desired CD of 220 Å. In FIG. 6, for example, deposition conditions in station 2 may be adjusted such that the final deposited thickness on wafer 2 is 101 Å. Such adjustments may be, for example, an additional cycle or a cycle with a different plasma power such that a total layer thickness of 101 Å is deposited on wafer 2. Similar adjustments may be made to all four wafers, as can be seen in FIG. 6, such that each final CD is the desired 220 Å.

In some implementations using "feedback" measurement information, such as information about physical characteristics that exist on the wafers in the multi-station deposition apparatus for deposition and/or regarding the relative deposition rates in the first and second stations, may be obtained and/or known during and/or after at least some deposition has occurred on a wafer. In such implementations, the multi-station deposition apparatus is configured to obtain such information, which may include the use of in situ metrology equipment such as that described herein. For instance, this "feedback" information may be obtained during and/or after, the concurrent deposition of the material on the first substrate in the first station and on the second substrate in the second station of the first technique of block 342 of FIG. 3. Additionally, during this block 342, "feedback" measurement information regarding the relative deposition rates in the first and second stations may be obtained, analyzed, and used to determine how to adjust the deposition conditions, as discussed herein. Similar to above, this "feedback" measurement information may be sent directly to the multi-station deposition apparatus controller that includes control logic for analyzing it and determining the appropriate adjustments to the deposition conditions or to a user.

Some embodiments of the present disclosure include a multi-station deposition apparatus. Such an apparatus may include some or all of the parts of the apparatuses described hereinabove, such as with respect to FIGS. 1 and 2. In some such embodiments, the multi-station apparatus may include a vacuum system (which may include vacuum pump 118 of FIG. 1), a precursor delivery system (which, for instance, may be configured similar to gas delivery system 101), a processing chamber (similar to process chamber 102) that includes at least two stations and each station may share the vacuum system and the precursor delivery system. The apparatus may also include a controller for controlling the multi-station deposition apparatus, such as the controller described above with respect to controller 250 of FIG. 2.

In some embodiments, the controller may control the multi-station deposition apparatus to deposit approximately equal thicknesses of a material on at least two substrates concurrently processed in separate stations and the controller may comprise control logic for implementing at least part of the techniques described herein with respect to FIGS. 3 and 5. For instance, the controller may comprise control logic for: (a) providing a first substrate in a first station and a second substrate in a second station of the deposition apparatus, (b) concurrently depositing the material on the first substrate in the first station and on the second substrate in the second station, wherein deposition conditions in the first and second stations are substantially the same, but yet produce a thicker layer of the material on the first substrate in the first station than on the second substrate in the second station, (c) adjusting the deposition conditions in the first station to slow or stop depositing the material on the first substrate while continuing to deposit the material on the second substrate in the second station under the conditions in (b), and (c) completing deposition on the first substrate in the first station and the second substrate in the second station such that a total thickness of the material deposited on the first substrate and on the second substrate is substantially equal.

In some embodiments, each station of the apparatus may include a showerhead that is configured to distribute a precursor of the material onto the substrate in that station (such as showerhead 106), and the precursor delivery system is configured to control delivery of the precursor of the material to each station. In some such embodiments, the controller may also include control logic for independently controlling precursor delivery to each station, and adjusting the deposition conditions in (c), above, includes reducing or stopping flow of the precursor to the first station.

In some embodiments, the apparatus may include a plasma source that is configured to independently form and maintain a plasma in each station (such as that described with respect to FIGS. 1 and 2). In some such embodiments, the controller may include control logic for independently forming and maintaining a plasma in each station, and the deposition conditions in (b) may include exposing the first substrate and the second substrate to the plasma. In some such embodiments, the controller may also include control logic for independently controlling a plasma power level in each station, and the adjusting the deposition conditions in (c) includes reducing or stopping the exposure of the first substrate to the plasma. In some other such embodiments, the controller may also include control logic for independently controlling a plasma time in each station, and adjusting the deposition conditions in (c) comprises reducing or stopping the exposure of the first substrate to the plasma.

Figure 7:
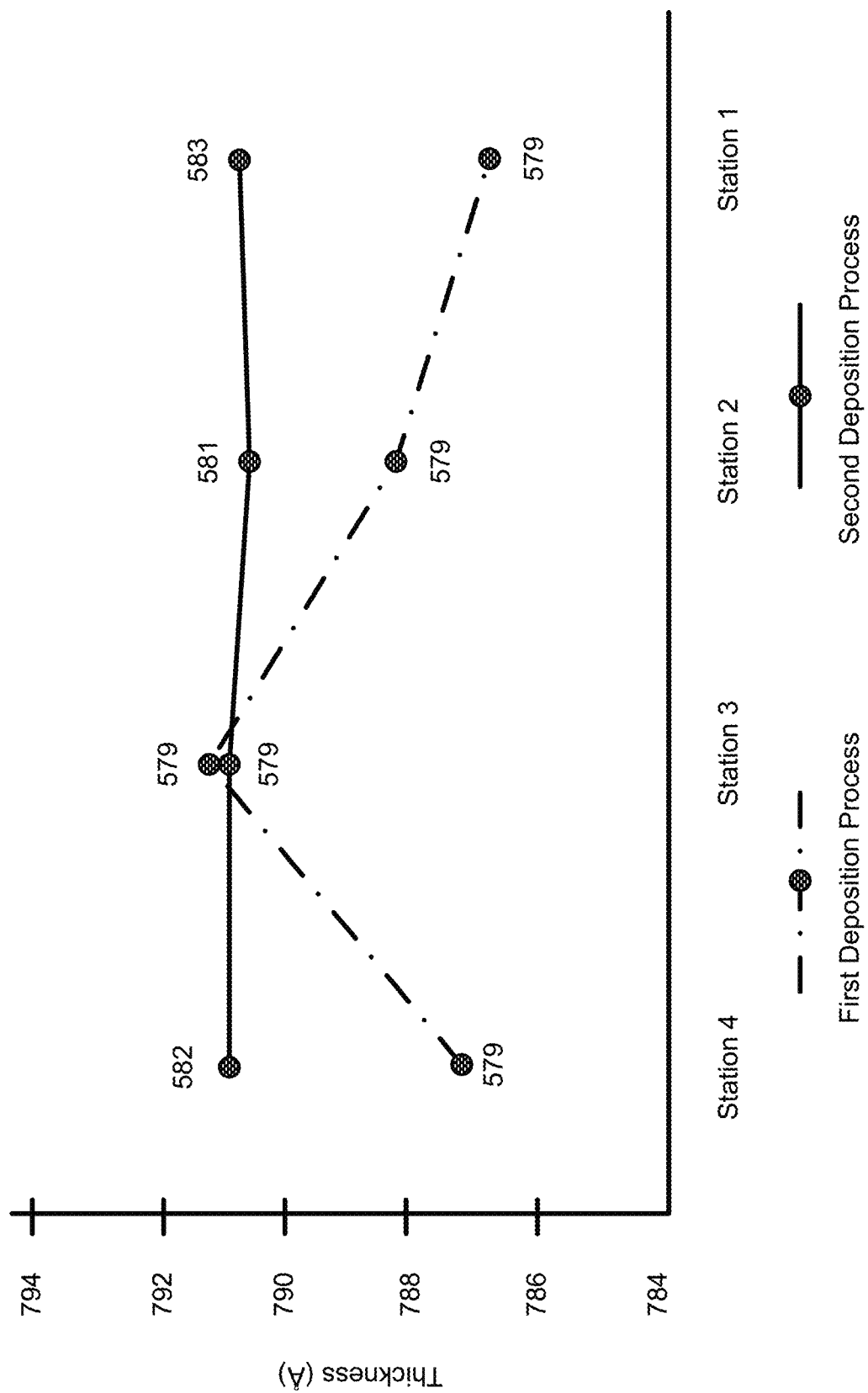
FIG. 7 depicts a graph of measured thicknesses for a four-station deposition apparatus for two different deposition processes.

The present inventors utilized techniques and apparatus disclosed herein to improve thickness matching across stations in a multi-station deposition apparatus as shown in FIG. 7. FIG. 7 depicts a graph of measured thicknesses for a four-station deposition apparatus for two different deposition processes. This may be similar to the apparatus discussed hereinabove. The y-axis represents the thickness in Angstroms (Å) and the x-axis indicates a processed wafer in each of the four stations. Each circle represents a total wafer thickness deposited after performing the number of cycles indicated above or below each circle. For the first deposition process, its data is shown with a dashed-dotted line, the inventors performed a cyclic deposition process for 579 cycles concurrently at each of the four stations which deposited layers of a material on each substrate such that the total thickness on each substrate does not match the other substrates' total thicknesses. As can be seen, the total thickness of material on the wafer in station 1 is approximately 787 Å, the total thickness of material on the wafer in station 2 is a little greater than 788 Å, the total thickness of material on the wafer in station 3 is between 791 Å and 792 Å, and the total thickness of material on the wafer in station 4 is approximately 787 Å. This is a total deviation of approximately 4.6 Å.

For the second deposition process, its data shown with a solid line, the inventors performed cyclic deposition processes using the techniques and the apparatus disclosed herein to achieve more consistent thickness matching between the stations. Here, the inventors began by performing concurrent cyclic depositions in all four stations for 579 cycles. However, while all four wafers remained in each station, respectively, the inventors performed additional, independent deposition cycles on the wafer in the other stations in order to achieve thickness across the stations of approximately 791 Å. As can be seen, station 1 received four additional deposition cycles to total 583 total cycles and a thickness of approximately 791 Å, station 2 received two additional cycles to total 581 total cycles and a thickness of approximately 791 Å, station 3 received no additional cycles and had a total thickness of approximately 791 Å, and station 4 received three additional cycles to total 582 total cycles and a thickness of approximately 791 Å.

In order to perform such additional deposition cycles and maximize throughput while minimizing costs and material usage, after performing the initial 579 cycles in all four stations, the inventors performed two additional deposition cycles concurrently in stations 1, 2, and 4, thereby totaling 581 total cycles in each of these stations, respectively, while the wafer in station 3 remained in its station and no additional deposition cycles were performed in station 3. Afterwards, one additional deposition cycle was performed concurrently on both stations 1 and 4, thereby totaling 582 total cycles in each of these stations, respectively, while the wafers in stations 2 and 3 remained in their respective stations and no additional deposition cycles were performed in stations 2 and 3. Finally, one additional deposition cycle was performed in station 1, thus totaling 583 cycles in that station, while the wafers in stations 2, 3, and 4 remained in their respective stations and no additional deposition cycles were performed in stations 2, 3, or 4. It should be noted that in all the deposition cycles of FIG. 7, the same deposition conditions were used for each deposition cycle. The thickness variation between the stations in FIG. 6 was reduced from approximately 4.6 Å in the first data set to approximately 0.4 Å for the second set, which is an approximate 10-fold reduction. In other embodiments, as discussed above, these additional cycles on each respective station may be performed at any point during the entire deposition process, such as at the beginning of the process.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. A method of semiconductor deposition for creating approximately equal thicknesses of a material on at least two substrates concurrently processed in separate stations of a multi-station deposition apparatus, the method comprising:
   (a) providing a first substrate in a first station and a second substrate in a second station of the deposition apparatus, the first station and the second station being contained within a common reaction chamber and sharing a power delivery system and a gas delivery system each coupled to the first and second stations;
   (b) concurrently performing at least a portion of N1 deposition cycles at the first station and the second station, wherein each N1 deposition cycle includes operations performed according to instructions of a first process recipe, comprising:
      (i) concurrently exposing the first substrate in the first station and the second substrate in the second station to a precursor from the gas delivery system, and
      (ii) concurrently activating a first reaction of the precursor on the first substrate in the first station by exposing the first substrate to plasma and activating a second reaction of the precursor on the second substrate in the second station by exposing the second substrate to plasma, wherein:
         performing the N1 deposition cycles creates a total deposition thickness T1 of the material on the first substrate, performing the N1 deposition cycles creates a total deposition thickness T2A of the material on the second substrate, and T1 is greater than T2A after completion of the N1 deposition cycles; and (c) subsequent to or prior to the completion of the at least the portion of the N1 deposition cycles at the first station and the second station, performing at least a portion of N2 deposition cycles at the second station, wherein each N2 deposition cycle includes operations performed according to instructions of a second process recipe which differ from the instructions of the first process recipe, comprising:

(i) concurrently exposing the first substrate in the first station and the second substrate in the second station to the precursor from the gas delivery system, and (ii) during the concurrent exposure of the first substrate and the second substrate to the precursor in (c)(i), activating a reaction of the precursor on the second substrate in the second station by exposing the second substrate to plasma while the first substrate is concurrently in the first station under adjusted conditions in which deposition of the material on the first substrate in the first station is not exposed to plasma, wherein:

performing the N2 deposition cycles creates a total deposition thickness T2B of the material on the second substrate, performing the N1 and N2 deposition cycles creates a total deposition thickness T2 of the material on the second substrate that is substantially equal to T1, a quantity of the N1 deposition cycles varying from a quantity of the N2 deposition cycles;

the N1 deposition cycles comprise a first plurality of sets of deposition cycles, and the N2 deposition cycles comprise a second plurality of sets of deposition cycles; and at least some of the first plurality of sets of deposition cycles and at least some of the second plurality of sets of deposition cycles are performed at different times in an alternating fashion.

2. The method of claim 1, wherein:

at least a portion of the instructions of the first process recipe specifies an amount of power delivered by the power delivery system to the first station; and during each N2 cycle, the first station receives no power from the power delivery system in accordance with the second process recipe.

3. The method of claim 1, wherein at least a portion of the instructions of the first process recipe specifies a duration of the plasma formed in the first station.

4. The method of claim 1, wherein:

the activating in each N1 cycle comprises independently providing plasma to the first station and plasma to the second station, and the activating in each N2 cycle comprises independently providing plasma to the second station while not providing plasma to the first station.

5. The method of claim 1, wherein the plasma exposed to the first substrate provided to the first station and the plasma provided to the second station are generated to have the same plasma power and/or the same plasma frequency.

6. The method of claim 1, wherein each of the plasma exposed to the first substrate in the first station and the plasma exposed to the second substrate in the second station comprises a high frequency plasma or a low frequency plasma.

7. The method of claim 1, wherein:

each of the N1 cycles comprises depositing a thin film of substantially equal thickness t1 of the material on the first substrate and a thin film of substantially equal thickness t2 of the material on the second substrate, and each of the N2 cycles comprises depositing a thin film of substantially equal thickness t2 of the material on the second substrate while not depositing a thin film on the first substrate.

8. The method of claim 1, wherein the first substrate does not move from the first station during (b) and (c).

9. The method of claim 1, wherein a first RF power is supplied to the first station during the N1 deposition cycles and a second RF power is supplied to the second station during the N1 deposition cycles, wherein the first RF power and the second RF power are within +/−5% of each other.

10. The method of claim 1, wherein a first pedestal in the first station is at a first temperature and a second pedestal in the second station is at a second temperature during the N1 deposition cycles, wherein the first temperature and second temperature are within +/−5% of each other.

11. The method of claim 1, further comprising performing a further N2 deposition cycle, wherein the further N2 cycle includes, subsequent to stopping a flow of the precursor to the first substrate in the first station, activating the reaction of the precursor on the second substrate in the second station by exposing the second substrate to plasma while the first substrate is concurrently in the first station.

12. The method of claim 1, wherein a total number of the N1 deposition cycles is different from a total number of the N2 deposition cycles.

13. The method of claim 1, wherein the at least the portion of the N1 deposition cycles comprises a first number of deposition cycles, the at least the portion of the N2 deposition cycles comprises a second number of deposition cycles, and the first number of deposition cycles is different from the second number of cycles.

14. The method of claim 1, wherein at least some of the first plurality of sets of deposition cycles are different from one another, and at least some of the second plurality of sets of deposition cycles are different from one another.

15. The method of claim 1, wherein at least some of the first plurality of sets of deposition cycles are different from at least some of the second plurality of sets of deposition cycles.

16. A multi-station deposition apparatus comprising:

a vacuum system;

a gas delivery system;

a processing chamber comprises at least two stations, wherein each station shares at least some features of the vacuum system and the gas delivery system;

a plasma system configured to independently ignite and maintain a plasma in each station; and a controller for controlling the multi-station deposition apparatus to deposit, by an atomic layer deposition process, approximately equal thicknesses of material on at least two substrates concurrently processed in a separate stations, the controller comprising control logic for causing:

(a) providing a first substrate in a first station and a second substrate in a second station of the deposition apparatus, (b) determining that the first station will deposit more material than the second station, (c) for at least one set of a plurality of sets of first deposition cycles, independently performing atomic layer deposition in the first station and the second station, including igniting plasma in each of the first station and the second station, wherein the first substrate remains in the first station and the second substrate remains in the second station while performing the atomic layer deposition, (d) before or after (c) and while the first substrate remains in the first station and the second substrate remains in the second station, for at least one set of a plurality of sets of second deposition cycles, stopping application of plasma power in the first station while continuing application of plasma power in the second station to thereby stop the atomic layer deposition in the first station while continuing the atomic layer deposition in the second station, wherein at least some of the plurality of sets of first deposition cycles and at least some of the plurality of sets of second deposition cycles are performed at different times in an alternating fashion; and (e) after completion of the plurality of sets of first deposition cycles and the plurality of sets of second deposition cycles and while the first substrate remains in the first station and the second substrate remains in the second station, stopping the continued application of plasma power in the second station such that a total thickness of a layer of the material deposited on a first substrate in the first station is substantially equal to a total thickness of a layer of the material deposited on a second substrate in the second station.

17. The apparatus of claim 16, wherein the gas delivery system comprises a first showerhead in the first station and a second showerhead in the second station, and wherein the gas delivery system comprises flow control structures upstream from the first showerhead and upstream from the second showerhead.

18. The apparatus of claim 16, wherein the gas delivery system is configured to independently control flow of a process gas to the first station and to the second station so that the process gas can flow to both stations concurrently, the first station only, or the second station only.

19. The apparatus of claim 16, wherein:
each station comprises a showerhead to distribute a precursor of the material onto a respective substrate in that station,
the gas delivery system is configured to control delivery of the precursor of the material to each station, and
(c) further comprises causing the controller to concurrently flow the precursor to the first and the second station, and
(d) further comprises causing the controller to concurrently flow the precursor to the first and the second station.

20. The apparatus of claim 16, wherein:
each station comprises a showerhead to distribute a precursor of the material onto a respective substrate in that station,
the gas delivery system is configured to control delivery of the precursor of the material to each station, and
(c) further comprises causing the controller to concurrently flow the precursor to the first and the second station, and
the controller further comprises control logic for causing the controller to flow the precursor to the second station and stop the flow of the precursor to the first station.

21. The apparatus of claim 16, wherein each of the plasma in the first station and the plasma in the second station in (c) comprises a high frequency plasma or a low frequency plasma.

22. The apparatus of claim 16, wherein the first substrate does not move from the first station during (b), (c), (d), and (e).

23. The apparatus of claim 16, wherein:
the plasma system has a RF power supply configured to deliver power each station, and
the depositing in (c) further comprises causing the controller to supply a first RF power to the first station and a second RF power to the second station, the first RF power and the second RF power are within +/−5% of each other.

24. The apparatus of claim 16, wherein:
the performing of the atomic layer deposition comprises performing a number of cyclic depositions to the first substrate and the second substrate, and the stopping of the application of plasma power in the first station occurs after the performing of the number of cyclic depositions;
after the stopping of the application of plasma power in the first station in (d) and before the stopping of the application of plasma power in the second station in (e), the total thickness of the layer of the material deposited on the first substrate in the first station is larger than the total thickness of the layer of the material deposited on the second substrate in the second station.

25. The apparatus of claim 16, wherein the controller further comprises control logic for causing:
after (c), based on the determining that the first station will deposit the material faster than the second station, adjusting at least one deposition condition in the first station, the adjusting of the at least one deposition condition comprising: the stopping of the application of plasma power in the first station, reducing a thickness of a layer deposited on the first substrate, or a combination thereof.

26. A method of atomic layer deposition for creating approximately equal thicknesses of a material on at least two substrates concurrently processed in separate stations of a multi-station deposition apparatus, the method comprising:
(a) providing a first substrate in a first station and a second substrate in a second station of the deposition apparatus,
(b) determining that the first station will deposit the material faster than the second station,
(c) for at least one set of a plurality of sets of first deposition cycles, independently performing atomic layer deposition in the first station and the second station, including igniting plasma in each station, wherein the first substrate remains in the first station and the second substrate remains in the second station while performing the atomic layer deposition,
(d) before or after (c) and while the first substrate remains in the first station and the second substrate remains in the second station, for at least one set of a plurality of sets of second deposition cycles, stopping application of plasma power in the first station while continuing application of plasma power in the second station to thereby stop the atomic layer deposition in the first station while continuing the atomic layer deposition in the second station, wherein at least some of the plurality of sets of first deposition cycles and at least some of the plurality of sets of second deposition cycles are performed at different times in an alternating fashion; and (e) after completion of the plurality of sets of first deposition cycles and the plurality of sets of second deposition cycles and while the first substrate remains in the first station and the second substrate remains in the second station, stopping the continued application of plasma power in the second station such that a total thickness of a layer of the material deposited on a first substrate in the first station is substantially equal to a total thickness of a layer of the material deposited on a second substrate in the second station.

\* \* \* \* \*